(12) United States Patent
Kim et al.

(10) Patent No.: US 10,163,867 B2
(45) Date of Patent: Dec. 25, 2018

(54) SEMICONDUCTOR PACKAGE AND MANUFACTURING METHOD THEREOF

(71) Applicant: Amkor Technology, Inc., Tempe, AZ (US)

(72) Inventors: Jin Seong Kim, Goyang-si (KR); Edwin J. Adlam, Phoenix, AZ (US); Ludovico E. Bancod, Chandler, AZ (US); Gi Jung Kim, Kyunggi-do (KR); Robert Lanzone, Chandler, AZ (US); Jae Ung Lee, Seoul (KR); Yung Woo Lee, Anyang-si (KR); Mi Kyeong Choi, Seoul (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 15/871,617

(22) Filed: Jan. 15, 2018

(65) Prior Publication Data

US 2018/0138155 A1    May 17, 2018

Related U.S. Application Data

(63) Continuation-in-part of application No. 15/149,144, filed on May 8, 2016.

(30) Foreign Application Priority Data

Nov. 12, 2015  (KR) .................. 10-2015-0159058

(51) Int. Cl.
*H01L 25/065*  (2006.01)
*H01L 25/00*   (2006.01)
(Continued)

(52) U.S. Cl.
CPC ........ *H01L 25/0657* (2013.01); *H01L 23/552* (2013.01); *H01L 25/50* (2013.01); *H01L 24/16* (2013.01); *H01L 24/32* (2013.01); *H01L 24/48* (2013.01); *H01L 24/73* (2013.01); *H01L 24/97* (2013.01); *H01L 2224/16225* (2013.01);
(Continued)

(58) Field of Classification Search
CPC .................................................. H01L 25/065
See application file for complete search history.

(56) References Cited

U.S. PATENT DOCUMENTS 6,177,731 B1   1/2001  Ishida et al.
6,546,620 B1   4/2003  Juskey et al.
(Continued)

FOREIGN PATENT DOCUMENTS

JP   2003060523   2/2003
JP   2010130003   6/2010
(Continued)

OTHER PUBLICATIONS

Korean Office Action dated Aug. 1, 2017 for Korean Patent Application No. 10-2017-0024100.
(Continued)

*Primary Examiner* — Marvin Payen
(74) *Attorney, Agent, or Firm* — McAndrews, Held & Malloy, Ltd.

(57) ABSTRACT

A semiconductor package and a method of manufacturing a semiconductor package. As a non-limiting example, various aspects of this disclosure provide a semiconductor package, and method of manufacturing thereof, that comprises shielding on multiple sides thereof.

20 Claims, 22 Drawing Sheets

(51) Int. Cl.
*H01L 23/552* (2006.01)
*H01L 23/00* (2006.01)

(52) U.S. Cl.
CPC ............... *H01L 2224/16227* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2224/97* (2013.01); *H01L 2225/06513* (2013.01); *H01L 2225/06537* (2013.01); *H01L 2225/06558* (2013.01); *H01L 2924/15153* (2013.01); *H01L 2924/15159* (2013.01); *H01L 2924/15311* (2013.01); *H01L 2924/181* (2013.01); *H01L 2924/19105* (2013.01); *H01L 2924/19106* (2013.01); *H01L 2924/3025* (2013.01)

(56) References Cited

U.S. PATENT DOCUMENTS

| | | |
|---|---|---|
| 7,163,843 B2 | 1/2007 | Kiendl |
| 7,741,151 B2 | 6/2010 | Amrine |
| 8,378,466 B2 | 2/2013 | Chiu |
| 8,420,437 B1 | 4/2013 | Fan |
| 8,901,718 B2 | 12/2014 | Cho |
| 9,070,693 B2 | 6/2015 | Cho |
| 9,780,074 B2 | 10/2017 | Kim et al. |
| 2010/0126765 A1 | 5/2010 | Kim et al. |
| 2013/0127025 A1 | 5/2013 | Cho |
| 2013/0217189 A1 | 8/2013 | Sasaki |
| 2014/0048913 A1 | 2/2014 | Park et al. |
| 2014/0299976 A1 | 10/2014 | Cho |
| 2015/0303170 A1 | 10/2015 | Kim et al. |
| 2016/0233196 A1 | 8/2016 | Kim et al. |
| 2016/0351509 A1 | 12/2016 | Dang |
| 2017/0141046 A1 | 5/2017 | Jeong et al. |
| 2017/0141081 A1 | 5/2017 | Lee et al. |

FOREIGN PATENT DOCUMENTS

| | | |
|---|---|---|
| JP | 2011082293 A | 4/2011 |
| KR | 20030083553 A | 10/2003 |
| KR | 20120032772 A | 4/2012 |
| KR | 10-2015-0000173 | 1/2013 |
| KR | 20140002458 A | 1/2014 |
| KR | 20140023112 A | 2/2014 |
| KR | 10-2013-0008666 | 1/2015 |
| KR | 101479248 B1 | 1/2015 |
| KR | 10201500001730 | 1/2015 |
| KR | 10-2015-0014568 | 2/2015 |
| KR | 20150123128 | 11/2015 |
| KR | 20150135048 | 12/2015 |

OTHER PUBLICATIONS

Korean Patent Office, Notice of Allowance in Application No. 10-2015-0159058, dated Jan. 6, 2017 (5 pages).
Korean Office Action dated Aug. 10, 2016 for Korean Patent Application No. 10-2015-0159058.
Korean Notice of Allowance dated May 1, 2017 for Korean Application No. 10-2016-0001657, 2 pages.
Korean Notice of Allowance dated Oct. 26, 2016 for Korean Patent Application No. 10-2015-0162075.
Korean Notice of Allowance dated Oct. 19, 2016 for Korean Patent Application No. 10-2015-0019458.

SEMICONDUCTOR PACKAGE AND MANUFACTURING METHOD THEREOF

CROSS-REFERENCE TO RELATED APPLICATIONS & INCORPORATION BY REFERENCE

The present application is a continuation-in-part of U.S. patent application Ser. No. 15/149,144, filed on May 8, 2016, and titled "SEMICONDUCTOR PACKAGE AND MANUFACTURING METHOD THEREOF", which makes reference to, claims priority to, and claims the benefit of Korean Patent Application No. 10-2015-0159058 filed on Nov. 12, 2015, in the Korean Intellectual Property Office and titled "SEMICONDUCTOR PACKAGE AND METHOD FOR MANUFACTURING THE SAME," the contents of each of which are incorporated herein by reference in their entirety.

BACKGROUND

Present semiconductor packages and methods for forming semiconductor packages are inadequate, for example resulting in excess cost, decreased reliability, inadequate shielding, package sizes that are too large, etc. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
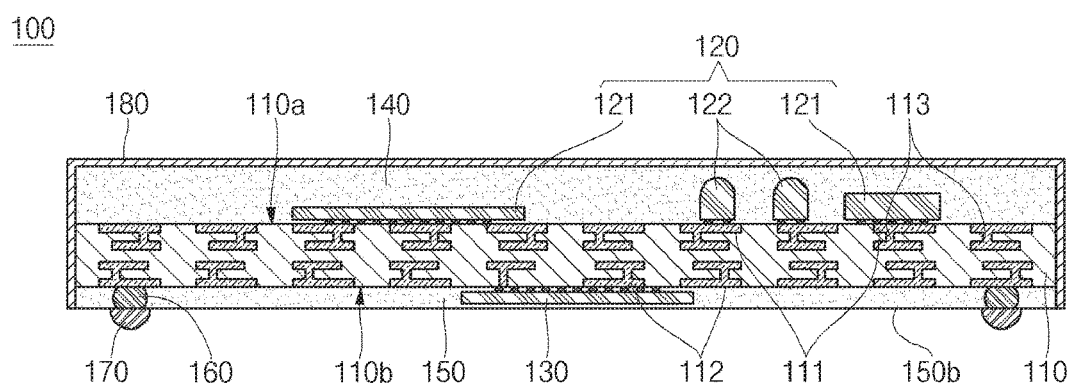
FIG. 1 is a cross-sectional view illustrating a semiconductor package according to an embodiment of the present disclosure.

Various aspects of this disclosure provide a semiconductor package and a method of manufacturing a semiconductor package. As a non-limiting example, various aspects of this disclosure provide a semiconductor package, and method of manufacturing thereof, that comprises shielding on multiple sides thereof.

DETAILED DESCRIPTION

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

In the drawings, the thickness or size of layers, regions, and/or components may be exaggerated for clarity. Accordingly, the scope of this disclosure should not be limited by such thickness or size. Additionally, in the drawings, like reference numerals may refer to like elements throughout the discussion. Elements numbered with an apostrophe (') can be similar to correspondingly numbered elements without apostrophe.

It will also be understood that when an element A is referred to as being "connected to" or "coupled to" an element B, the element A can be directly connected to the element B or indirectly connected to the element B (e.g., an intervening element C (and/or other elements) may be present between the element A and the element B).

Certain embodiments of the disclosure relate to a semiconductor package and a method for manufacturing the same.

Various electronic devices for exchanging signals as well as a plurality of semiconductor packages manufactured in various structures are integrated in various electronic systems, and thus electromagnetic interference (EMI) may be unavoidably generated while electrically operating the semiconductor packages and the electronic devices.

EMI may be generally defined as a synthetic radiation of an electric field and a magnetic field. The EMI may be generated by an electric field formed by the current flowing in a conducting material and a magnetic field.

If the EMI is generated from the semiconductor packages and the electronic devices densely packed on a motherboard, other neighboring semiconductor packages may be directly or indirectly affected by the EMI and may be damaged.

Various aspects of the present disclosure provide a semiconductor package and a method for manufacturing the same, which can prevent warpage by forming a molding on both surfaces of a substrate and can shield electromagnetic interference (EMI) by an EMI shielding layer formed to cover the molding and the substrate.

According to an aspect of the present disclosure, there is provided a semiconductor package including a substrate having a first surface and a second surface opposite to the first surface, at least one first electronic device formed on the first surface and electrically connected to the substrate, a first molding formed on the first surface to cover the first electronic device, a second molding formed to cover the second surface, a plurality of first conductive bumps formed on the second surface and electrically connected to the substrate and passing through the second molding, an electromagnetic interference (EMI) shielding layer formed to surround surfaces of the substrate, the first molding and the second molding to be spaced apart from the first conductive bumps, and a plurality of second conductive bumps formed on one surface of the second molding to be electrically connected to the plurality of first conductive bumps, respectively.

According to another aspect of the present disclosure, there is provided a method for manufacturing a semiconductor package including a substrate having a first surface and a second surface opposite to the first surface, at least one first electronic device formed on the first surface and electrically connected to the substrate, and a plurality of first conductive bumps formed on the second surface and electrically connected to the substrate, the method including forming a first molding on the first surface to cover the first electronic device and forming a second molding on the second surface to cover the first conductive bumps, grinding the second molding to expose the plurality of first conductive bumps to the outside, forming a plurality of second conductive bumps electrically connected to the exposed plurality of first conductive bumps, respectively, placing a jig under the second molding to surround the plurality of second conductive bumps, and forming an EMI shielding layer to cover surfaces of the substrate, the first molding and the second molding, which are exposed to the outside through the jig.

According to still another aspect of the present disclosure, there is provided a method for manufacturing a semiconductor package including a substrate having a first surface and a second surface opposite to the first surface, at least one first electronic device formed on the first surface and electrically connected to the substrate, and a plurality of first conductive bumps formed on the second surface and electrically connected to the substrate, the method including forming a first molding on the first surface to cover the first electronic device and forming a second molding on the second surface to cover the first conductive bumps, grinding the second molding to expose the plurality of first conductive bumps to the outside, forming an EMI shielding layer to entirely cover surfaces of the substrate, the first molding and the second molding, forming a plurality of exposing holes in the EMI shielding layer to expose the plurality of first conductive bumps to the outside, and forming a plurality of second conductive bumps electrically connected to the exposed plurality of first conductive bumps through the plurality of exposing holes, respectively.

In one example, a method of manufacture can include providing a substrate comprising: a substrate top surface having a substrate top first pad and a substrate top second pad, a substrate bottom surface having a substrate bottom first pad and a substrate bottom second pad, and a substrate lateral surface. The method can also include attaching a first electronic device to the substrate top surface, the first electronic device coupled to the substrate top first pad and comprising a first device first surface facing the substrate top surface, a first device lateral surface, and a first device second surface facing away from the substrate top surface. The method can also include coupling a first passive component to the substrate top second pad, and applying a first encapsulant to encapsulate the substrate top surface, the first passive component, and the first electronic device, where the first encapsulant has a first encapsulant top surface, and a first encapsulant lateral surface. The method can also include attaching a second electronic device to the substrate bottom surface, the second electronic device coupled to the substrate bottom first pad and comprising a second device first surface facing the substrate bottom side, a second device lateral surface, and a second device second surface facing away from the substrate bottom surface. The method can also include providing a first external interconnect coupled to the substrate bottom second pad, and applying a second encapsulant to encapsulate the substrate bottom surface and the second electronic device, the second encapsulant comprising a second encapsulant lateral surface. In one example, the method can also include applying a first electromagnetic interference (EMI) shield as a layer that bounds at least: the first encapsulant top surface, the first encapsulant lateral surface, and the substrate lateral surface, wherein the first EMI shield is spaced apart from the external interconnect. In the same or another example, the method can also include applying an electromagnetic interference (EMI) shield surrounding a perimeter of the second device, in contact with the second encapsulant, and exclusive of sheet metal.

In one example, a semiconductor package can include a substrate having a substrate top surface having a substrate top first pad and a substrate top second pad, a substrate bottom surface having a substrate bottom first pad and a substrate bottom second pad, and a substrate lateral surface. The package can also include a first electronic device on the substrate top surface and coupled to the substrate top first pad, the first electronic device comprising: a first device first surface facing the substrate top surface, a first device lateral surface, and a first device second surface facing away from the substrate top surface. The package can also include a first passive component coupled to the substrate top second pad, and a first encapsulant that encapsulates the substrate top surface, the passive component, and the first electronic device, the first encapsulant having a first encapsulant top surface, and a first encapsulant lateral surface. The package can also include a second electronic device on the substrate bottom surface and coupled to the substrate bottom first pad, the second electronic device comprising: a second device first surface facing the substrate bottom surface, a second device lateral surface, and a second device second surface facing away from the substrate bottom surface. The package can also include a first external interconnect coupled to the substrate bottom second pad and comprising a first external interconnect height, and a second encapsulant that encapsulates the substrate bottom surface and the second electronic device, the second encapsulant comprising: a second encapsulant lateral surface, and a second encapsulant height, where the first external interconnect height protrudes further than the second encapsulant height. The package can also include a first electromagnetic interference (EMI) shield that bounds at least: the first encapsulant top surface, the first encapsulant lateral surface, and the substrate lateral surface, wherein the first EMI shield is spaced apart from the external interconnect.

As described above, in the semiconductor package and the method for manufacturing the same according to the present disclosure, warpage can be prevented by forming a molding on both surfaces of a substrate and electromagnetic interference (EMI) can be shielded by an EMI shielding layer formed to cover the molding and the substrate.

Further embodiments, features, and advantages of the present disclosure, as well as the structure and operation of the various embodiments of the present disclosure, are described in detail below with reference to the accompanying drawings.

Referring to FIG. 1, a cross-sectional view illustrating a semiconductor package according to an embodiment of the present disclosure is illustrated.

As illustrated in FIG. 1, the semiconductor package 100 includes a substrate 110, a first electronic device 120, a second electronic device 130, a first molding 140, a second molding 150, first conductive bumps 160, second conductive bumps 170 and an electric-magnetic interference (EMI) shielding layer 180.

The substrate 110 is shaped of a panel, which has a first surface 110a and a second surface 110b opposite to the first surface 110a. Here, the first surface 110a of the substrate 110 may be a top surface and the second surface 110b may be a bottom surface, and vice versa. The substrate 110 includes a plurality of first wire patterns 111 formed on the first surface 110a and a plurality of second wire patterns 112 formed on the second surface 110b. In addition, the substrate 110 may further include a plurality of conductive patterns 113 electrically connecting the first wire patterns 111 formed on the first surface 110a of the substrate 110 and the second wire patterns 112 formed on the second surface 110b. The conductive patterns 113 may be configured to penetrate between the first surface 110a and the second surface 110b of the substrate 110 or to partially penetrate to connect a plurality of wire patterns formed of multiple layers. That is to say, in a case where the substrate 110 is a single layer, the conductive patterns 113 may directly connect the first wire patterns 111 and the second wire patterns 112 or may connect the first wire patterns 111 and the second wire patterns 112 using additional wire patterns. That is to say, the first wire patterns 111, the second wire patterns 112 and the conductive patterns 113 of the substrate 110 may be implemented in various structures and types, but aspects of the present disclosure are not limited thereto.

The first electronic device(s) 120 is mounted on the first surface 110a of the substrate 110 to be electrically connected to the first wire patterns 111 of the substrate 110. The first electronic device(s) 120 may include semiconductor dies 121 and passive elements 122, which may be modified in various manners according to the type of the semiconductor package 100, but aspects of the present disclosure are not limited thereto. In the following description, the first electronic device 120(s) including two semiconductor dies 121 and two passive elements 122 will be described by way of example. In addition, the semiconductor dies 121 are formed in a flip chip type and may be mounted such that conductive bumps of the semiconductor dies 121 are welded to the first wire patterns 111 of the substrate 110. The semiconductor dies 121 may include bond pads and may be connected to the first wire patterns 111 by wire bonding. However, the present disclosure does not limit the connection relationship between the semiconductor dies 121 and the first wire patterns 111 to that disclosed herein.

The second electronic device(s) 130 is mounted on the second surface 110b of the substrate 110 to be electrically connected to the second wire patterns 112 formed on the substrate 110. The second electronic device 130(s) consisting of a single semiconductor die is illustrated. However, the second electronic device(s) 130 may consist of a plurality of semiconductor dies or may further include a passive element, but aspects of the present disclosure are not limited thereto.

The first molding 140 may be formed on the first surface 110a of the substrate 110 to cover the first electronic device(s) 120 mounted on the first surface 110a of the substrate 110. The first molding 140 may be made of a general molding compound resin, for example, an epoxy-based resin, but the scope of this disclosure is not limited thereto. The first molding 140 may protect the first electronic device 120 from external circumstances.

The second molding 150 may be formed on the second surface 110b of the substrate 110 to cover the second electronic device(s) 130 mounted on the second surface 110*b* of the substrate 110. The second molding 150 exposes the first conductive bumps 160 formed on the second surface 110*b* of the substrate 110 to the outside while completely covering the second electronic device(s) 130. The second molding 150 and the first conductive bumps 160 may have the same height. The second molding 150 and the first molding 140 may be made of the same material. The second molding 150 may protect the second electronic device 130 from external circumstances.

The first conductive bumps 160 may include a plurality of first conductive bumps formed on the second surface 110*b* of the substrate 110 to be electrically connected to the second wire patterns 112 formed on the substrate 110. The first conductive bumps 160 are configured such that side portions thereof are surrounded by the second molding 150 and portions of bottom surfaces thereof are exposed to the outside through the second molding 150. The exposed first conductive bumps 160 are electrically connected to the second conductive bumps 170. That is to say, the first conductive bumps 160 electrically connect the second conductive bumps 170 and the second wire patterns 112 formed on the substrate 110. The first conductive bumps 160 may include conductive pillars, copper pillars, conductive balls or copper balls, but aspects of the present disclosure are not limited thereto.

The second conductive bumps 170 may be formed on a bottom surface of the second molding 150 to be electrically connected to the first conductive bumps 160 exposed to the outside through the second molding 150. In a case where the semiconductor package 100 is mounted on an external device, such as a motherboard, the second conductive bumps 170 may be used in electrically connecting the semiconductor package 100 to the external device.

The EMI shielding layer 180 may be formed to a predetermined thickness enough to entirely cover the semiconductor package 100, except for the bottom surface of the second molding 150. That is to say, the EMI shielding layer 180 is formed to cover all of the top surface and four side surfaces of the semiconductor package 100. In addition, the EMI shielding layer 180 may be made of a conductive material and may be electrically connected to a ground of the semiconductor package 100 or an external ground. The EMI shielding layer 180 may shield EMI induced to (or generated by) the semiconductor package 100. In addition, the semiconductor package 100 may include the first and second moldings 140 and 150 to cover both of the first and second surfaces 110*a* and 110*b* of the substrate 110, thereby preventing warpage of the semiconductor package 100, which may occur when a molding is formed only on one surface of the substrate 110.

Figure 2:
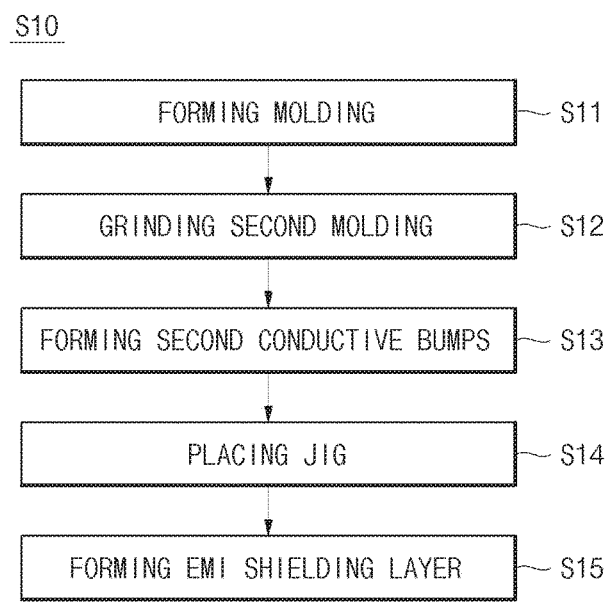
FIG. 2 is a flowchart illustrating a method for manufacturing the semiconductor package illustrated in FIG. 1.

Referring to FIG. 2, a flowchart illustrating a method for manufacturing the semiconductor package illustrated in FIG. 1 is illustrated. As illustrated in FIG. 2, the method for manufacturing the semiconductor package 100 (S10) includes forming a molding (S11), grinding a second molding (S12), forming second conductive bumps (S13), placing a jig (S14) and forming an EMI shielding layer (S15).

Referring to FIGS. 3A to 3E, cross-sectional views illustrating various steps of the method for manufacturing the semiconductor package illustrated in FIG. 2 are illustrated.

First, before the forming of the molding (S11), the first electronic device 120 is mounted on the first surface 110*a* of the substrate 110 to be electrically connected to the first wire patterns 111, the second electronic device 130 is mounted on the second surface 110*b* of the substrate 110 to be electrically connected to the second wire patterns 112, and the plurality of first conductive bumps 160 are then formed on the second surface 110*b* of the substrate 110 to be electrically connected to the second wire patterns 112.

Figure 3A:
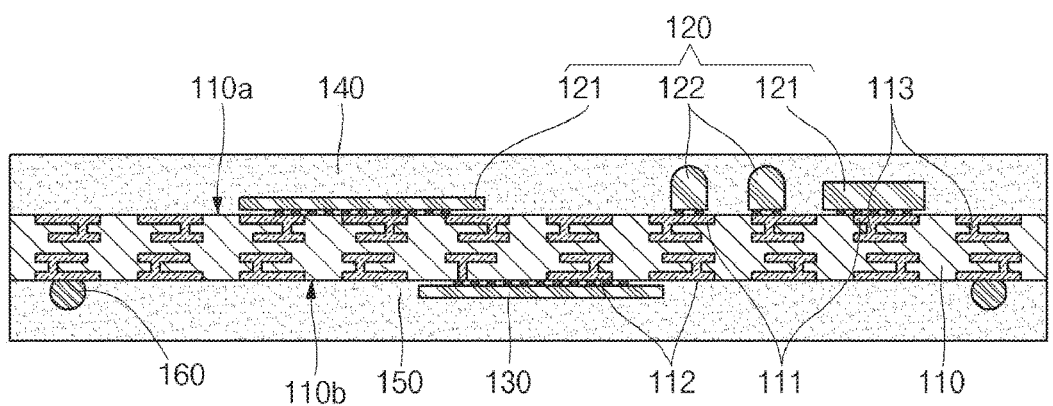
FIGS. 3A to 3E are cross-sectional views illustrating various steps of the method for manufacturing the semiconductor package illustrated in FIG. 2.

As illustrated in FIG. 3A, in the forming of the molding (S11), the first molding 140 is formed to cover the first surface 110*a* of the substrate 110 and the first electronic device 120, and the second molding 150 is formed to cover the second surface 110*b* of the substrate 110, the second electronic device 130 and the plurality of first conductive bumps 160. The first molding 140 and the second molding 150 may be formed at the same time. For example, a mold is placed to surround the substrate 110 including the first electronic device 120, the second electronic device 130 and the first conductive bumps 160, and a molding resin is injected into a space in the mold, thereby forming the first molding 140 and the second molding 150 at the same time. Here, in a state in which the first electronic device 120, the second electronic device 130, the first conductive bumps 160 and the substrate 110 are spaced apart from the inner surface of the mold so as not to contact the inner surface of the mold, the molding resin is injected into the mold, thereby forming the first molding 140 and the second molding 150. That is to say, the first molding 140 is formed to entirely cover the first surface 110*a* of the substrate 110 and the first electronic device 120, and the second molding 150 is formed to entirely cover the second surface 110*b* of the substrate 110, the second electronic device 130 and the first conductive bumps 160.

Figure 3B:
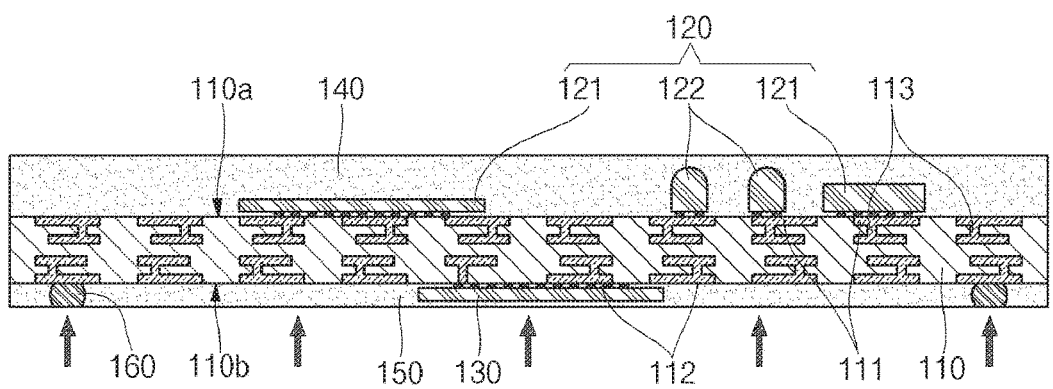

As illustrated in FIG. 3B, in the grinding of the second molding (S12), a bottom surface of the second molding 150 is grinded to expose the first conductive bumps 160 to the outside of the second molding 150. That is to say, in the grinding of the second molding (S12), the second molding 150 is grinded to expose the first conductive bumps 160 to the outside. At this time, bottom portions of the first conductive bumps 160 may also be partially grinded. Bottom surfaces of the first conductive bumps 160 and the bottom surface of the second molding 150 may be coplanar. In addition, the second electronic device 130 may be positioned within the second molding 150 and the second electronic device 130 may, for example, not be exposed to the outside. The grinding may be performed using, for example, a diamond grinder and an equivalent thereof, but aspects of the present disclosure are not limited thereto.

Figure 3C:
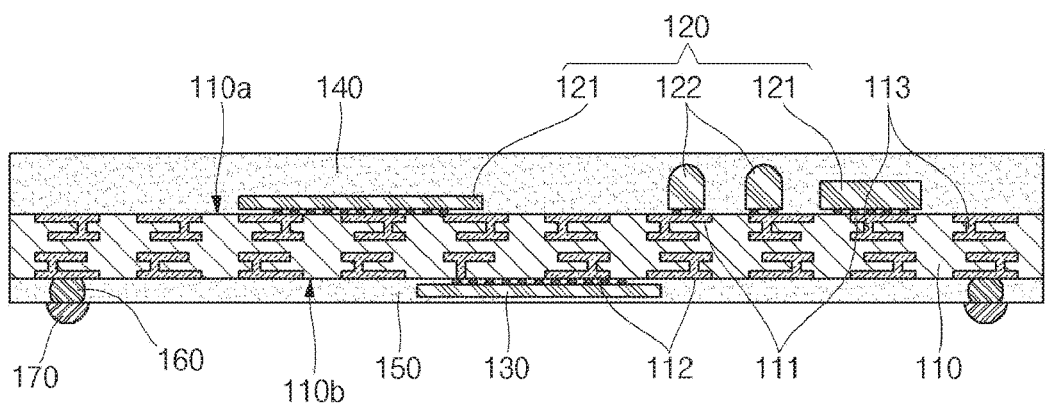

As illustrated in FIG. 3C, in the forming of the second conductive bumps (S13), the plurality of second conductive bumps 170 are formed to be electrically connected to the plurality of first conductive bumps 160 exposed to the outside in the grinding of the second molding (S12), respectively. The second conductive bumps 170 may be formed using one of ball dropping, screen printing, electroplating, vacuum evaporation, plating and equivalents thereof, but aspects of the present disclosure are not limited thereto. In addition, the second conductive bumps 170 may be made of a metallic material, such as lead/tin (Pb/Sn) or leadless Sn, and equivalents thereof, but aspects of the present disclosure are not limited thereto.

Figure 3D:
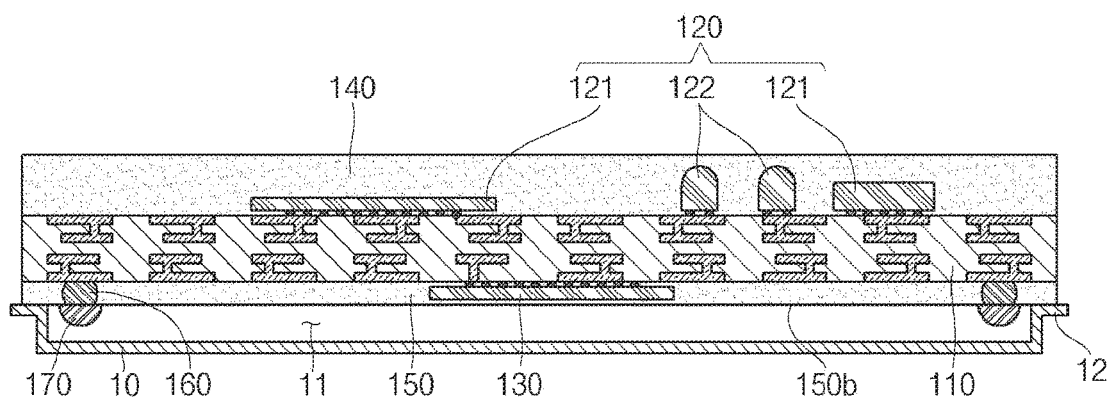

As illustrated in FIG. 3D, in the placing of the jig (S14), the jig 10 is loaded and placed to cover the bottom surface 150*b* of the second molding 150. The jig 10 is shaped of a substantially rectangular frame and may have an internal space 11 having a predetermined depth in a top-to-bottom direction and a planar part 12 outwardly extending a predetermined length along the outer circumference. The planar part 12 may be brought into contact with the outer circumference of the bottom surface 150*b* of the second molding 150 to then be fixed, the second conductive bumps 170 formed on the bottom surface 150*b* of the second molding 150 may be inserted into the internal space 11. That is to say, in the placing of the jig (S14), the jig 10 is placed to cover the bottom surface 150b of the second molding 150, and the first molding 140, the side surface of the substrate 110 and the side surface of the second molding 150 are exposed to the outside.

Figure 3E:
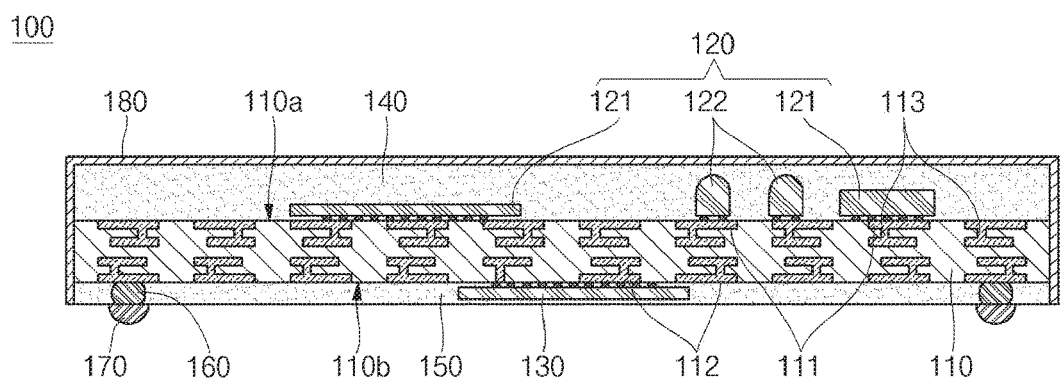

As illustrated in FIG. 3E, in the forming of the EMI shielding layer (S15), EMI shielding layer 180 is formed on the first molding 140, the side surface of the substrate 110 and the side surface of the second molding 150, which are exposed to the outside in the placing of the jig (S14). The EMI shielding layer 180 is formed to entirely cover all of the first molding 140, the side surface of the substrate 110 and the side surface of the second molding 150, except for the bottom surface 150b of the second molding 150 covered by the jig 10. That is to say, the EMI shielding layer 180 is formed to entirely cover four side surfaces and the top surface of the semiconductor package 100, except for the bottom surface of the semiconductor package 100. The EMI shielding layer 180 may be formed to a predetermined thickness by plasma deposition or spraying, but aspects of the present disclosure are not limited thereto. In addition, after the forming of the EMI shielding layer (S15), in order to remove metal residuals produced in the forming of the EMI shielding layer 180 made of a conductive material, cleaning may further be performed. In addition, after the EMI shielding layer 180 is formed and the cleaning is performed, the jig 10 positioned under the second molding 150 is separated to complete the semiconductor package 100 having the EMI shielding layer 180. In FIGS. 3A to 3E, a single semiconductor package 100 is manufactured, but a plurality of semiconductor packages may be formed on the substrate 110 to then be divided through a singulation process into a discrete semiconductor package 100.

Figure 4:
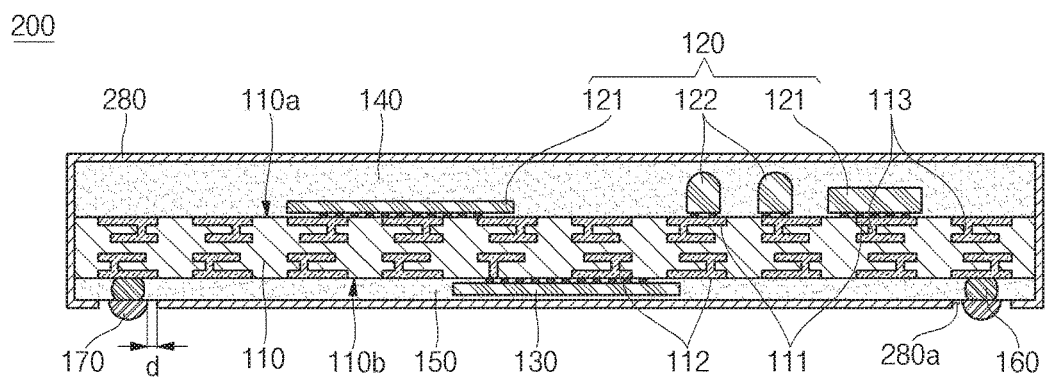
FIG. 4 is a cross-sectional view illustrating a semiconductor package according to another embodiment of the present disclosure.

Referring to FIG. 4, a cross-sectional view illustrating a semiconductor package according to another embodiment of the present disclosure is illustrated.

As illustrated in FIG. 4, the semiconductor package 200 includes a substrate 110, a first electronic device 120, a second electronic device 130, a first molding 140, a second molding 150, first conductive bumps 160, second conductive bumps 170 and an EMI shielding layer 280. The semiconductor package 200, including the substrate 110, the first electronic device 120, the second electronic device 130, the first molding 140, the second molding 150, the first conductive bumps 160 and the second conductive bumps 170, has the same configuration with the semiconductor package 100 illustrated in FIG. 1. Therefore, the following description of the semiconductor package 200 will focus on the EMI shielding layer 280, which is a different feature from the semiconductor package 100 illustrated in FIG. 1.

The EMI shielding layer 280 is formed to cover a top surface, four side surfaces and a bottom surface of the semiconductor package 200 to a predetermined thickness and may expose second conductive bumps 170 to the outside. That is to say, the EMI shielding layer 280 may be formed to entirely cover the semiconductor package 200, except for the second conductive bumps 170. In addition, the EMI shielding layer 280 may be made of a conductive material and may be electrically connected to a ground of the semiconductor package 200 or an external ground.

The EMI shielding layer 280 may include a plurality of exposing holes 280a. The second conductive bumps 170 may be exposed to the outside of the EMI shielding layer 280 through the exposing holes 280a. That is to say, the exposing holes 280a of the EMI shielding layer 280 may be located to correspond to the second conductive bumps 170.

In addition, the exposing holes 280a may have larger widths than diameters of the second conductive bumps 170. That is to say, the EMI shielding layer 280 may be spaced a predetermined distance (d) apart from the second conductive bumps 170 by the exposing holes 280a and may be electrically disconnected from the second conductive bumps 170 made of a conductive material. Here, portions surrounding the second conductive bumps 170 in the second molding 150 may be exposed to the outside of the exposing holes 280a of the EMI shielding layer 280.

The EMI shielding layer 280 is formed to cover all surfaces of the semiconductor package 200, except for the second conductive bumps 170 as external terminals, thereby shielding EMI induced from (or induced upon) the semiconductor package 200.

Figure 5A:
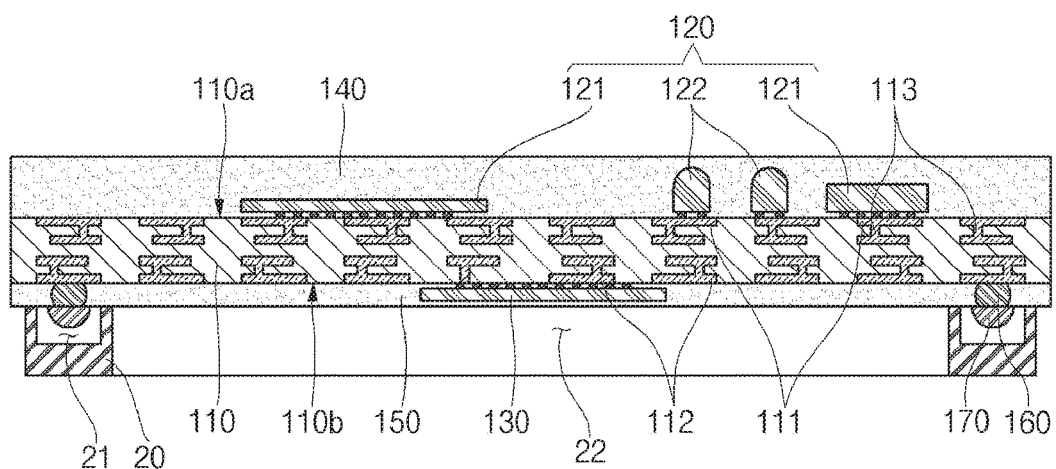
FIGS. 5A and 5B are cross-sectional views illustrating various steps in manufacturing the semiconductor package illustrated in FIG. 4 by the semiconductor package manufacturing method illustrated in FIG. 2.
Figure 5B:
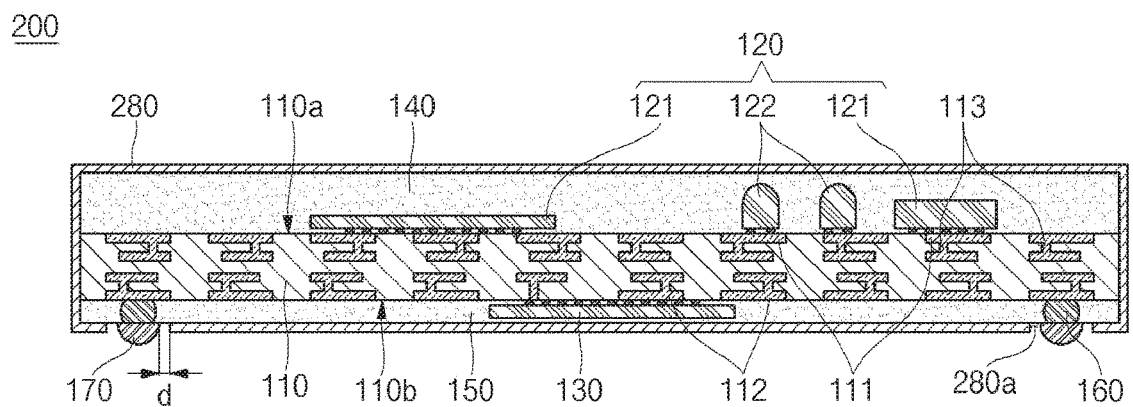

The semiconductor package 200 illustrated in FIG. 4 may be manufactured by the semiconductor package manufacturing method illustrated in FIG. 2. Referring to FIGS. 5A and 5B, cross-sectional views illustrating various steps in the method for manufacturing the semiconductor package illustrated in FIG. 4 by the semiconductor package manufacturing method illustrated in FIG. 2 are illustrated. Hereinafter, the method for manufacturing the semiconductor package 200 will be described with reference to FIGS. 2, 5A and 5B.

As illustrated in FIG. 2, the method for manufacturing the semiconductor package 200 (S10) includes forming a molding (S11), grinding a second molding (S12), forming second conductive bumps (S13), placing a jig (S14) and forming an EMI shielding layer (S15). Here, the forming of the molding (S11), the grinding of the second molding (S12) and the forming of the second conductive bumps (S13) are the same as the corresponding steps in the method for manufacturing the semiconductor package 100 illustrated in FIGS. 3A to 3C. Therefore, the following description of the method for manufacturing the semiconductor package 200 (S10) will focus on the placing of the jig (S14) and the forming of the EMI shielding layer (S15), which are different features from the method for manufacturing the semiconductor package 100 illustrated in FIGS. 3A to 3C, with reference to FIGS. 5A and 5B.

Figure 6:
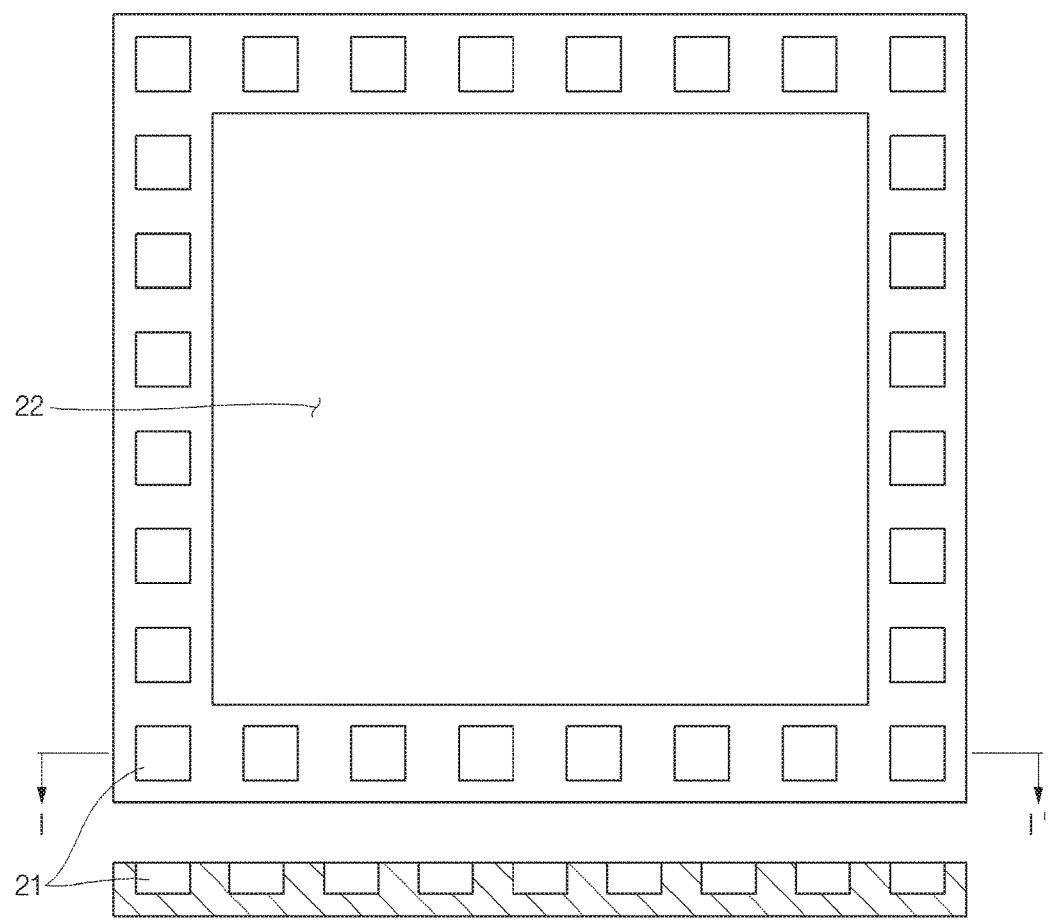
FIG. 6 illustrates a plan view and a cross-sectional view illustrating a structure of a jig illustrated in FIG. 5A.

As illustrated in FIG. 5A, in the placing of the jig (S14), the jig 20 is loaded and placed to cover a bottom portion of the second molding 150. As illustrated in FIG. 6, the jig 20 is shaped of a substantially rectangular frame and may have a plurality of grooves 21 having a depth in a top-to-bottom direction. The jig 20 may include the plurality of grooves 21 located to correspond to second conductive bumps 170 of the semiconductor package 200 and the second conductive bumps 170 may be inserted into the plurality of grooves 21, respectively. That is to say, the second conductive bumps 170 may be surrounded by the jig 20. Here, in order to allow the second conductive bumps 170 into the plurality of grooves 21 of the jig 20, the plurality of grooves 21 preferably have larger diameters than the second conductive bumps 170.

In addition, the jig 20 is shaped of a rectangular ring having its central portion opened by a centrally formed hole 22. That is to say, a central portion of the bottom surface 150b of the second molding 150, which is not adjacent to (or immediately adjacent to) the second conductive bumps 170, is exposed to the outside through the hole 22 of the jig 20. The EMI shielding layer 280 may also be formed on a bottom surface of the semiconductor package 200 through the hole 22 of the jig 20.

In the placing of the jig (S14), the jig 20 is placed under the second molding 150 to cover the second conductive bumps 170 and exposes a first molding 140, a substrate 110 and the second molding 150 to the outside.

As illustrated in FIG. 5B, in the forming of the EMI shielding layer (S15), the EMI shielding layer 280 is formed on the first molding 140, the substrate 110 and the second molding 150, which are exposed to the outside in the placing of the jig (S14). That is to say, in the forming of the EMI shielding layer (S15), the EMI shielding layer 280 is formed to cover a top surface, four side surfaces and a bottom surface of the semiconductor package 200, except for the second conductive bumps 170, using the jig 20 as a mask. The EMI shielding layer 280 may be formed to a predetermined thickness by plasma deposition or spraying, but aspects of the present disclosure are not limited thereto. In addition, after the forming of the EMI shielding layer (S15), in order to remove metal residuals produced in the forming of the EMI shielding layer 280 made of a conductive material, cleaning may further be performed. In addition, after the EMI shielding layer 280 is formed and the cleaning is performed, the jig 20 positioned under the second molding 150 is separated to complete the semiconductor package 200 having the EMI shielding layer 280. In addition, once the jig 20 is separated, since the EMI shielding layer 280 is not formed on the second conductive bumps 170 surrounded by the jig 20 and portions around the second conductive bumps 170, exposing holes 280a exposing the second conductive bumps 170 are provided in the EMI shielding layer 280. Then, the EMI shielding layer 280 may be electrically disconnected from the second conductive bumps 170 by the exposing holes 280a and may be spaced a predetermined distance (d) apart from the second conductive bumps 170.

Figure 7:
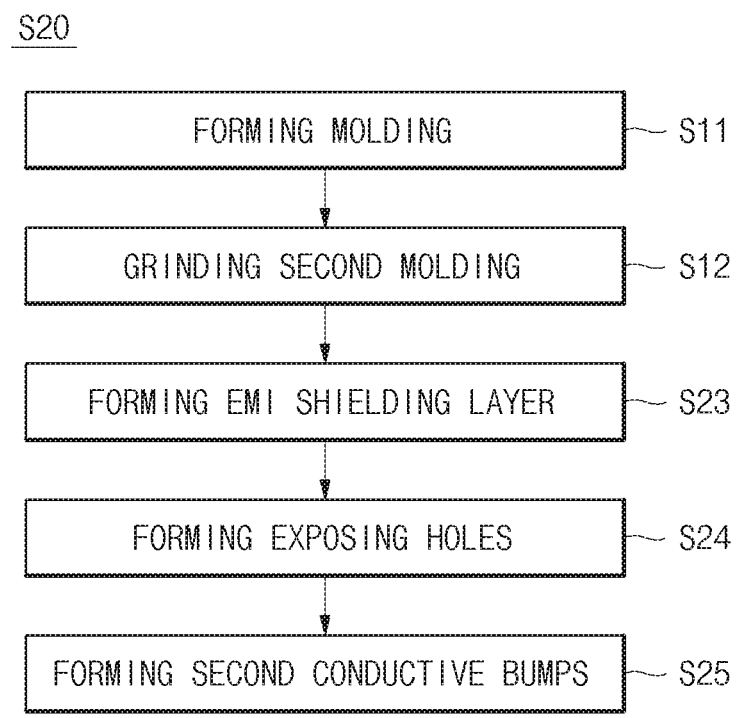
FIG. 7 is a flowchart illustrating a method for manufacturing the semiconductor package illustrated in FIG. 4 according to another embodiment of the present disclosure.

Referring to FIG. 7, a flowchart illustrating a method for manufacturing the semiconductor package illustrated in FIG. 4 according to another embodiment of the present disclosure is illustrated. As illustrated in FIG. 7, the method for manufacturing the semiconductor package 200 (S20) includes forming a molding (S11), grinding a second molding (S12), forming an EMI shielding layer (S23), forming exposing holes (S24) and forming second conductive bumps (S25). Here, the forming of the molding (S11) and the grinding of the second molding (S12) illustrated in FIG. 7 are the same as the corresponding steps in the method for manufacturing the semiconductor package 100 illustrated in FIGS. 2, 3A and 3B.

Figure 8A:
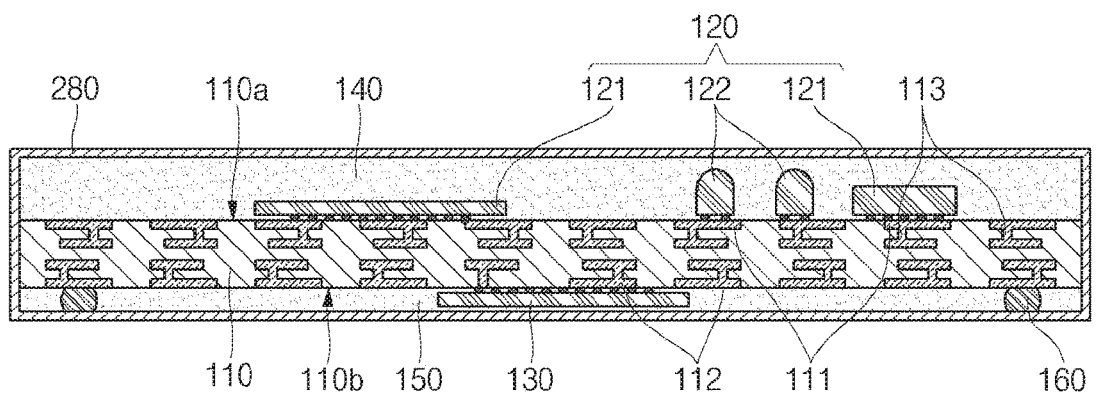
FIGS. 8A to 8C are cross-sectional views illustrating various steps of the method for manufacturing the semiconductor package illustrated in FIG. 7.
Figure 8B:
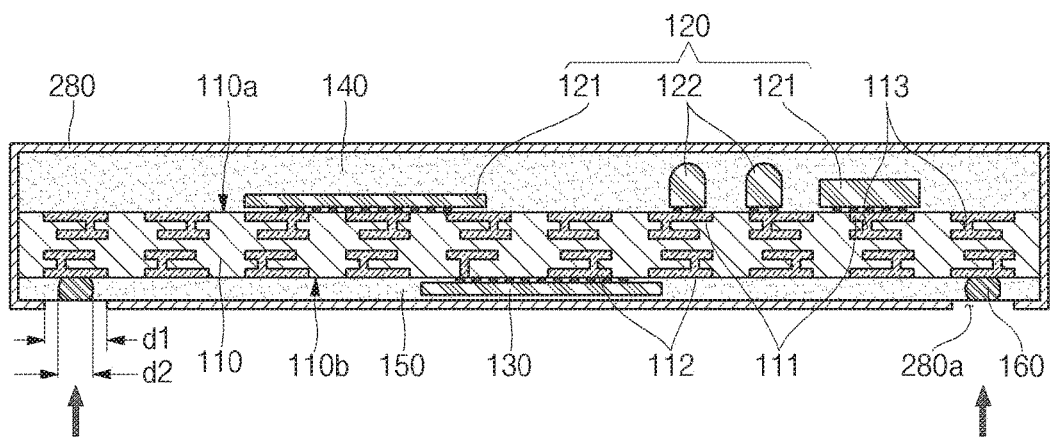
Figure 8C:
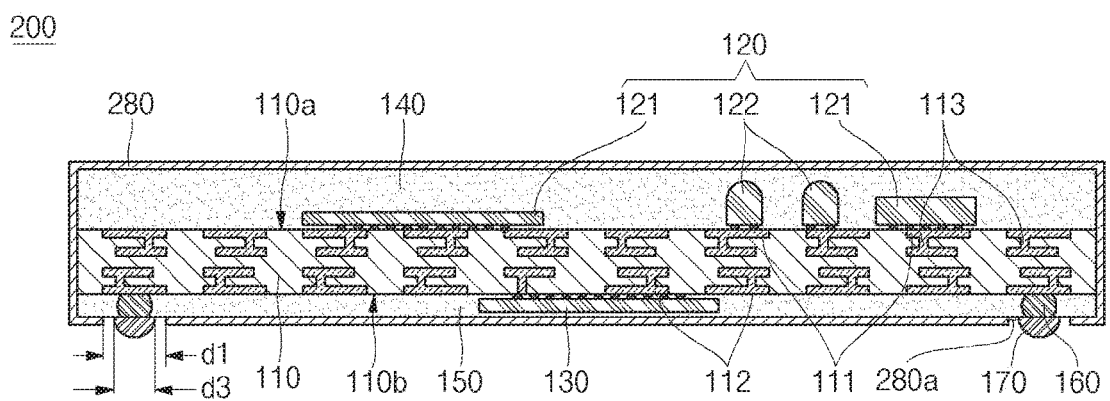

Referring to FIGS. 8A to 8C, cross-sectional views illustrating the steps of forming an EMI shielding layer (S23), forming exposing holes (S24) and forming second conductive bumps (S25) of FIG. 7 are illustrated. Therefore, the method for manufacturing the semiconductor package 200 (S20) will be described with reference to FIGS. 7 and 8A to 8C.

As illustrated in FIG. 8A, in the forming of the EMI shielding layer (S23), the EMI shielding layer 280 is formed to entirely cover the substrate 110, the first molding 140 and the second molding 150. The EMI shielding layer 280 may be formed to a predetermined thickness by plasma deposition or spraying, but aspects of the present disclosure are not limited thereto.

As illustrated in FIG. 8B, in the forming of the exposing holes (S24), the EMI shielding layer 280 may be partially removed to expose the first conductive bumps 160 to the outside. That is to say, the first conductive bumps 160 are exposed to the outside by forming a plurality of exposing holes 280a in the EMI shielding layer 280. The plurality of exposing holes 280a of the EMI shielding layer 280 are formed by removing a portion of the EMI shielding layer 280 by etching or laser. In addition, the forming of the exposing holes 280a may be performed by any process known in the art so long as an EMI shielding material can be patterned in a desired pattern, but not limited to etching or laser as disclosed herein. As illustrated in FIG. 8B, a width (d1) of each of the exposing holes 280a is preferably larger than a diameter (d2) of each of the first conductive bumps 160. In order to electrically disconnect the first conductive bumps 160 from second conductive bumps 170 to be described later, the exposing holes 280a are preferably formed to have a sufficient large width (i.e., d1). In addition, after the forming of the exposing holes 280a, a cleaning process for removing metal residuals may further be performed.

As illustrated in FIG. 8C, in the forming of the second conductive bumps (S25), the second conductive bumps 170 are formed to be electrically connected to the first conductive bumps 160 exposed to the outside by the exposing holes 280a. The second conductive bumps 170 are preferably formed to have a larger diameter (d3) than the width (d1) of the exposing holes 280a. That is to say, the second conductive bumps 170 may be spaced a predetermined distance apart from the EMI shielding layer 280 to be electrically disconnected from the EMI shielding layer 280.

Figure 9A:
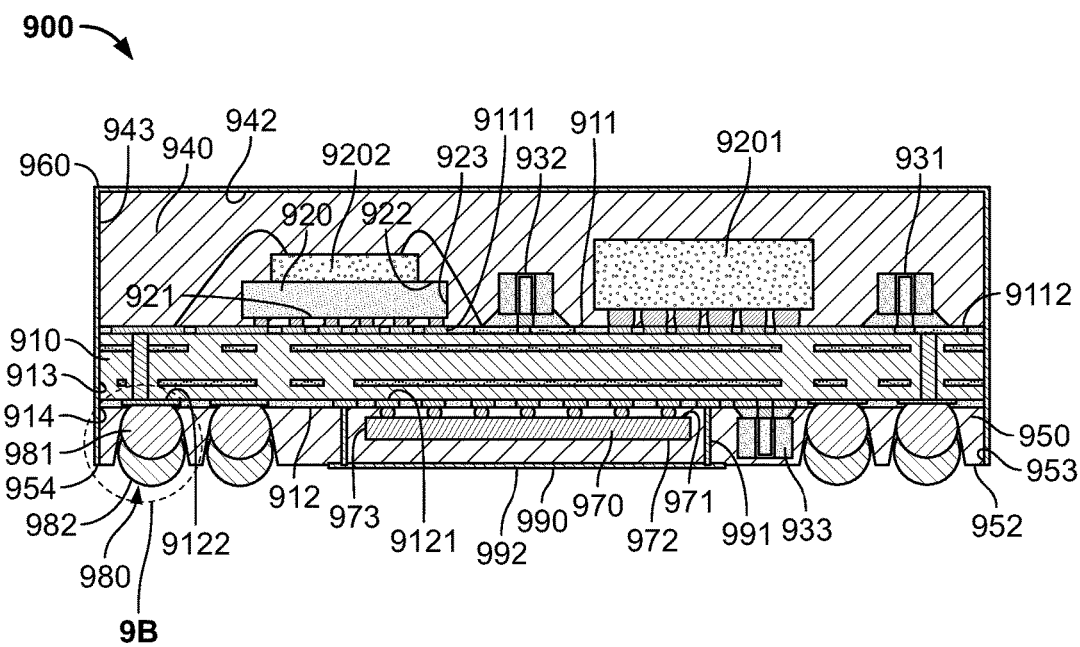
FIG. 9A illustrates a cross-section view of a semiconductor package according to one example.
Figure 9B:
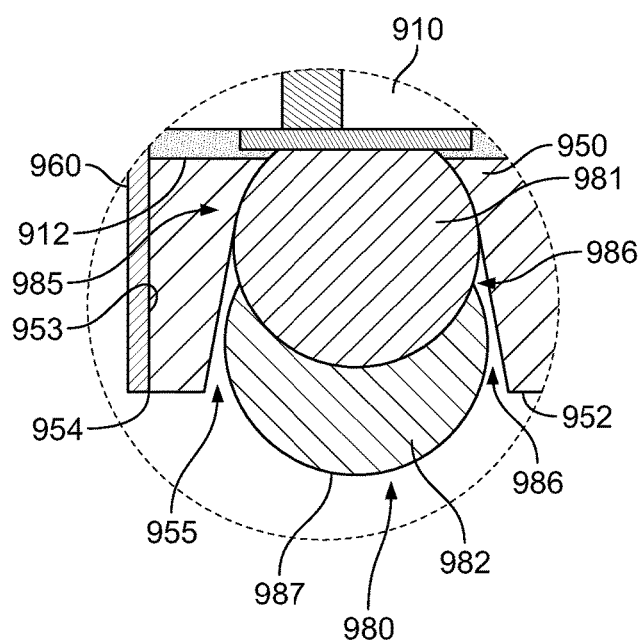
FIG. 9B illustrates a magnified portion of the semiconductor package from FIG. 9A.

FIG. 9A illustrates a cross-section view of semiconductor package 900 according to one example. FIG. 9B illustrates a magnified portion of semiconductor package 900 from FIG. 9A. Semiconductor package 900 and its elements can be similar to any one or more of the other semiconductor packages or their corresponding elements described herein, and characteristics of semiconductor package 900 are further described below.

Semiconductor package 900 comprises substrate 910 having substrate top surface 911, substrate bottom surface 912, and substrate lateral surface 913 therebetween. Substrate 910 also comprises substrate top first pad 9111 at substrate top surface 911, and substrate bottom first pad 9121 at substrate bottom surface 912. Substrate 910 can be similar to any of the substrates described herein, such as substrate 110. In the same or other examples, substrate 910 can comprise a redistribution structure (RDS) having one or more dielectric layers of dielectric material and one or more conductive layers between and through the dielectric layers. Such conductive layers can define pads, traces and vias through which electrical signals or voltages can be distributed horizontally and vertically across the RDS.

Semiconductor package 900 also comprises electronic device 920 attached to substrate top surface 911 and coupled to substrate top first pad 9111. Electronic device 920 can include one or more transistors, and can comprise a microcontroller device, a radio-frequency (RF) device, a wireless (WiFi, WLAN, etc.) switch, a power amplifier device, a low noise amplifier (LNA) device, etc. There can also be examples where electronic device 920 can comprise a MEMS (Micro-Electro-Mechanical-System) device that can include one or more transducers. Electronic device 920 comprises device surface 921 facing substrate top surface 911, device surface 922 facing away from substrate top surface 911, and device lateral surface 923 therebetween. In the present example, electronic device 920 comprises a semiconductor die having bumps at device surface 921, and is flip-chip mounted onto substrate top surface 911 such that one of such bumps contacts substrate top first pad 9111. The term "bumps" can refer to ball bumps, such as solder bumps or solder-coated copper-core bumps, and/or can refer to metallic post bumps such as copper pillars with or without solder tips. In other examples, electronic device 920 can comprise a semiconductor die with its inactive surface facing towards substrate top surface 911 and with one or more wirebonds extending from its active surface to one or more pads at substrate top surface 911. There can also be examples where electronic device 920 can comprise a packaged device having one or more semiconductor die within, and optionally having another substrate coupling such one or more semiconductor die together, where such packaged device can couple to one or more pads at substrate top surface 911.

In the present example, semiconductor package 900 also comprises one or more passive components coupled to substrate top surface 911, such as passive component 931 that is coupled to substrate top second pad 9112. In some examples, such one or more passive components can comprise capacitors, inductors, and/or resistors. Although in the present example passive component 931 is presented as a surface-mount-technology (SMT) device coupled to substrate top second pad 9112 via SMT joints, there can be other examples where passive component 931 can be packaged or mounted differently, such as via wirebonds or bumps.

Several configurations of different devices and components can be coupled to substrate top surface 911. For example, besides electronic device 920 and passive component 931, FIG. 9 shows electronic device 9201, electronic device 9202, and passive component 932 coupled to substrate 910 at substrate top surface 911. Electronic device 9201 and/or electronic device 9202 can be similar to one or more of the different device options described with respect to electronic device 920. As an example, electronic device 920 can comprise a microcontroller device, while electronic device 9201 can comprise a MEMS device, such as a gyroscope, a microphone, a pressure sensor, or a gas sensor, among others. Although electronic device 9201 is shown bonded to substrate top surface 910 through bumps, there can be other embodiments where electronic device 9201 can be wirebonded instead. Furthermore, as an option, electronic device 9202 is shown coupled to substrate top surface 910 via wirebonds, while stacked atop electronic device 920. Passive component 932 can be similar to passive component 931, and is shown coupled to substrate top surface 911 between electronic device 920 and electronic device 9201.

Encapsulant 940 is shown at FIG. 9 encapsulating substrate top surface 911, along with all components coupled to it, including electronic devices 920, 9201, and 9202, and passive components 931 and 932. Although the present example shows encapsulant 940 covering both lateral and top surfaces of such devices and components, there can be examples where the top surfaces of one or more of such devices or components may be left exposed by encapsulant 940.

FIG. 9 also presents electronic device 970 attached to substrate bottom surface 912 and coupled to substrate bottom first pad 9121. Electronic device 970 can be similar to one or more of the different device options described with respect to electronic device 920, and comprises device surface 971 facing substrate bottom surface 912, device surface 972 facing away from substrate bottom surface 912, and device lateral surface 973 therebetween. In the present example, electronic device 970 comprises a semiconductor die having bumps at device surface 971, and is flip-chip mounted onto substrate bottom surface 912 such that one of such bumps contacts substrate bottom first pad 9121. In other examples, electronic device 970 can comprise a semiconductor die with its inactive surface facing towards substrate bottom surface 912 and with one or more wirebonds extending from its active surface to one or more pads at substrate bottom surface 912. There can also be examples where electronic device 970 can comprise a packaged device having one or more semiconductor die within, and optionally having another substrate coupling such one or more semiconductor die together, where such packaged device can couple to one or more pads at substrate bottom surface 912.

Semiconductor package 900 also comprises external interconnects, such as external interconnect 980, configured to interface or attach semiconductor package 900 to an external device, such as to an external substrate or board part of a larger electronic apparatus. External interconnect 980 is coupled to substrate bottom second pad 9122 of substrate 910, and protrudes from substrate bottom surface 912 further than device surface 972 of electronic device 970. External interconnect 980 is shown comprising interconnect inner portion 981 adjacent substrate bottom surface 912, and interconnect distal portion 982 disposed distally from substrate bottom surface 912. Although both interconnect inner portion 981 and interconnect distal portion 982 are presented as stacked conductive solder balls in the present example, there can be other examples where one or both of them can be, for instance, a solder-encapsulated copper or metallic core ball, or a conductive post plated, wirebonded, or otherwise attached to substrate bottom surface 912. As another option, external interconnect 980 can be a single conductive structure instead of stacked conductive structures, such as a single solder ball, or a single conductive post or pillar.

Encapsulant 950 is shown at FIG. 9 encapsulating substrate bottom surface 912, along with any components coupled to it, including electronic device 970 and passive component 933. Although the present example shows encapsulant 950 covering both lateral and bottom surfaces of such devices and components, there can be examples where the bottom surfaces of one or more of such devices or components may be left exposed by encapsulant 950. Encapsulant 950 bounds external interconnect 980 while leaving the distal end of external interconnect 980 exposed and protruded from encapsulant bottom surface 952. In some examples, the material of encapsulant 950 can be similar to one or more of the materials described for encapsulant 940. For instance, encapsulant 940 can comprise a layer of a mold material, and encapsulant 940 can comprise a layer of the same mold material, whether applied concurrently or integrally with the layer of encapsulant 940 or not.

FIG. 9B includes a magnified view that presents details of external interconnect 980 relative to encapsulant 950. As seen in the magnified view, encapsulant 950 comprises through-via 955 that reveals different portions of external interconnect 980. For example, interconnect encapsulated section 985 is attached to substrate bottom surface 912 and is bounded by and in contact with encapsulant 950. Interconnect exposed section 986 is depressed within through-via 955 and bounded by, but detached from, encapsulant 950. Interconnect protruded section 987 not only is exposed from encapsulant 950, but also protrudes further than encapsulant bottom surface 952.

FIG. 9 further shows electromagnetic interference (EMI) shield 960 that covers encapsulant top surface 942 and encapsulant lateral surface 943 of encapsulant 940, and substrate lateral surface 913 of substrate 910. EMI shield 960 also covers encapsulant lateral surface 953 of encapsulant 950 in the present example, and leaves at least a portion of encapsulant bottom surface 952 exposed such that EMI shield 960 remains spaced apart from external interconnect 980. In the present example, EMI shield 960 comprises a layer of continuous conformal coating that conforms to respective contours, including any surface irregularities or coarseness, of and/or between encapsulant top surface 942, encapsulant lateral surface 943, substrate lateral surface 913, and encapsulant lateral surface 953.

Semiconductor package 900 also comprises in the present example compartment shield 990, which can be an EMI shield configured to provide EMI protection within a compartment area encompassing one or more components, such as electronic device 970. Compartment shield 990 comprises compartment lateral barrier 991 that bounds device lateral surface 973 along a perimeter of electronic device 970, and also comprises compartment bottom barrier 992 that bounds device surface 972.

In some examples, compartment lateral barrier 991 can be a plurality of conductive posts, such as pillars or wires, whether plated, wirebonded, soldered, or otherwise coupled, that are lined up in one or more rows adjacent at least a portion of the perimeter of electronic device 970. Compartment bottom barrier 992 covers the area under device surface 972 and contacts compartment lateral barrier 991. Compartment bottom barrier 992 can be a metallic plate or a conformal coating similar to the conformal coating of EMI shield 960. In some examples, compartment bottom barrier 992 can be a portion of the layer of conformal coating of EMI shield 960, but there can be other examples where compartment bottom barrier 992 can be formed independently of and/or sequentially to EMI shield 960. The conductive posts of compartment lateral barrier 991 are exposed at encapsulant bottom surface 952 to permit contact with compartment bottom barrier 992 and, as seen in the present example, can protrude past encapsulant bottom surface 952 such that lateral portions of such conductive post protrusions can be covered by the material of compartment bottom barrier 992.

There can also be examples where compartment lateral barrier 991 and compartment bottom barrier 992 of compartment shield 990 can comprise a single continuous piece of material that bounds both device surface 972 and device lateral surface 973 of electronic device 970, such as a metallic can or cover, or such as one or more wires wirebonded as a wire cage to substrate bottom surface 912 from one side to a different side of electronic device 970. Some examples can also comprise compartment shield(s) similar to compartment shield 990 shielding devices or components other than, or in addition to, electronic device 970.

Figure 10A:
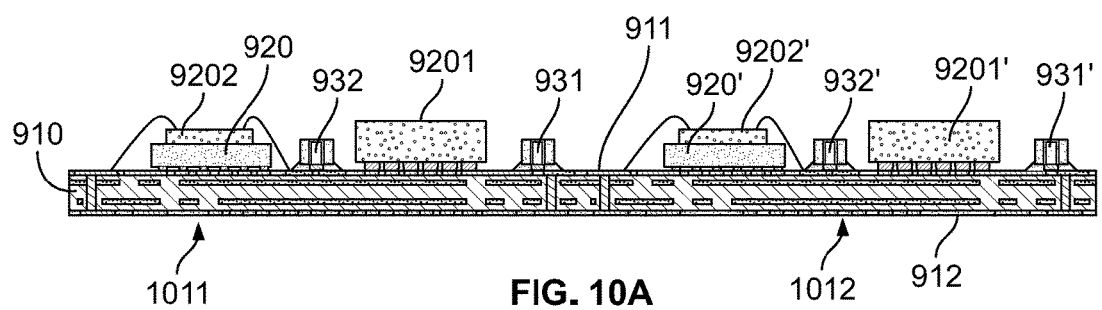
FIGS. 10A-10C illustrate various initial semiconductor package assembly stages.
Figure 10B:
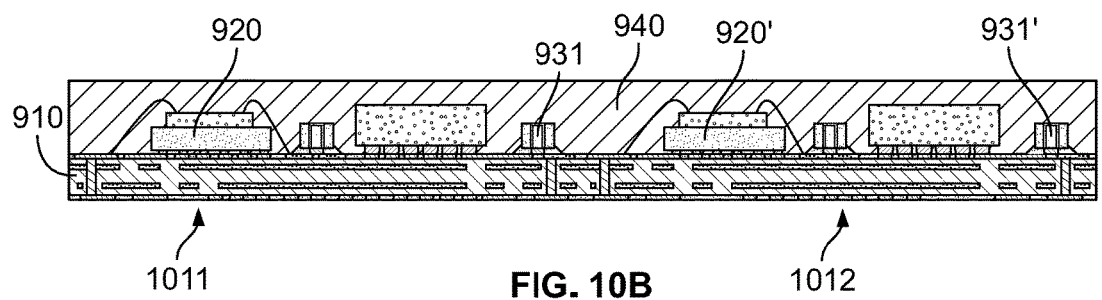
Figure 10C:
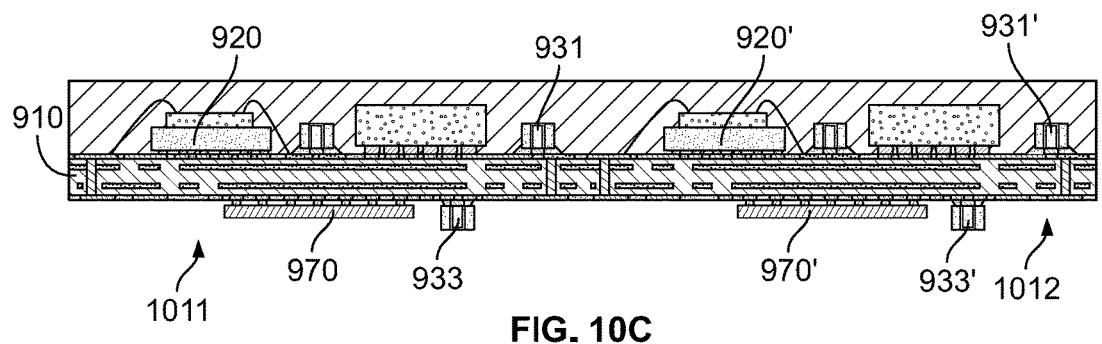
Figure 17A:
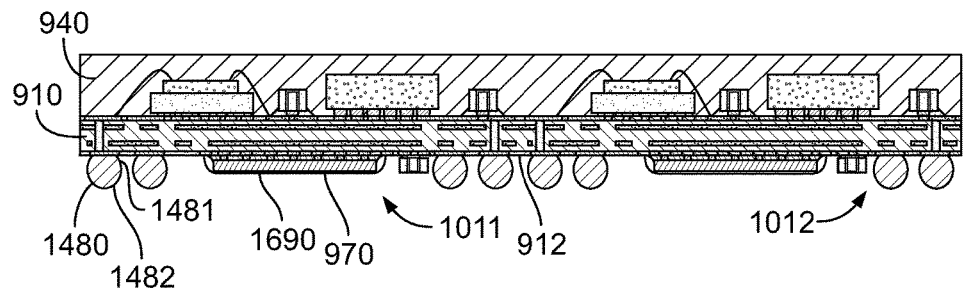
FIGS. 17A-17C illustrate various later semiconductor package assembly leading to the semiconductor package of FIG. 16.
Figure 17B:
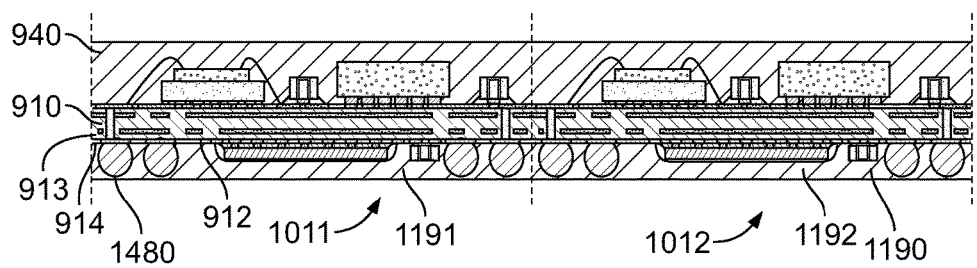
Figure 17C:
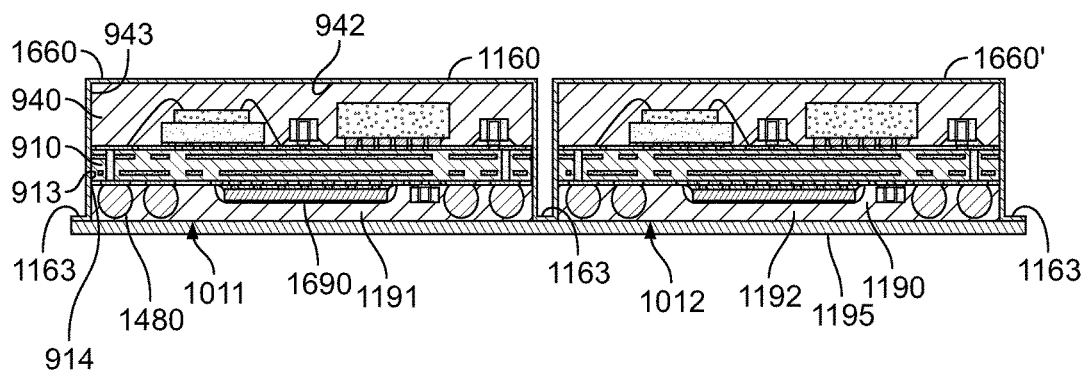
Figure 18:
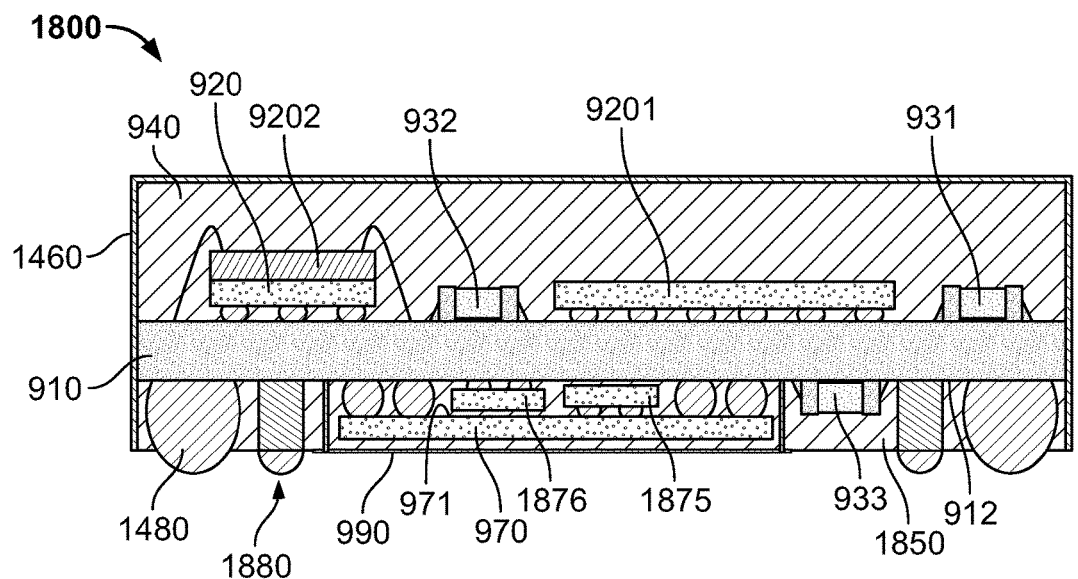
FIG. 18 illustrates a cross-section view of a semiconductor package according to one example.

FIGS. 10A-10C illustrate various initial stages of assembly for a semiconductor package similar to one or more of those described here, such as for example semiconductor package 900 (FIGS. 9, 11), semiconductor package 1200 (FIGS. 12-13), semiconductor package 1400 (FIGS. 14-15), semiconductor package 1600 (FIGS. 16-17), and/or semiconductor package 1800 (FIG. 18). FIG. 10A presents substrate 910 prior to singulation, including multiple sections defining adjacent portions that can be subsequently singulated into individual packages, such as unit portion 1011 and unit portion 1012.

In some examples, substrate 910 can be prefabricated and can comprise a laminate substrate, such as a printed circuit board, and which may be in the form of a strip or a panel. In the same or other examples, substrate 910 can include a core layer, such as fiberglass or other rigid nonconductive material, between the dielectric layers of its RDS to add structural rigidity. There can be other examples, however, where substrate 910 can be a build-up substrate instead of prefabricated, and/or can be coreless. In such examples, the different dielectric layers and conductive layers of the RDS of substrate 910 can built-up by layering and pattering on each other while supported by a removable carrier located under substrate bottom surface 912. Such carrier can be a wafer or panel comprising semiconductor, glass, or metallic material.

Unit portion 1011 of substrate 910 comprises electronic devices 920, 9201, 9202 and passive components 931 and 932 coupled to substrate top surface 911. Correspondingly, unit portion 1012 of substrate 910 comprises electronic devices 920', 9201', 9202' and passive components 931' and 932' are coupled to substrate top surface 911.

FIG. 10B presents a subsequent stage of assembly where encapsulant 940 is applied to encapsulate all devices and components coupled to substrate top surface 911 across and between both unit portion 1011 and unit portion 1012. Encapsulant 940 comprises a single layer of non-conductive material, such as a resin, a polymer composite material, a polymer having a filler, an epoxy resin, an epoxy resin, an epoxy acrylate having a filler such as silica or other inorganic material, a mold compound, a silicone resin, and/or a resin-impregnated B-stage pre-preg film, among others. In examples where encapsulant 940 comprises a mold compound, such material can be applied via any of several ways, such as through compression molding, injection molding, or film-assisted molding.

FIG. 10C illustrates a subsequent stage of assembly where components are added to substrate bottom surface 912. For example, electronic devices 970 and passive component 933 are coupled to substrate bottom surface 912 at unit portion 1011 of substrate 910. Correspondingly, electronic device 970' and passive component 933' are coupled to substrate bottom surface 912 at unit portion 1012 of substrate 910.

Figure 11A:
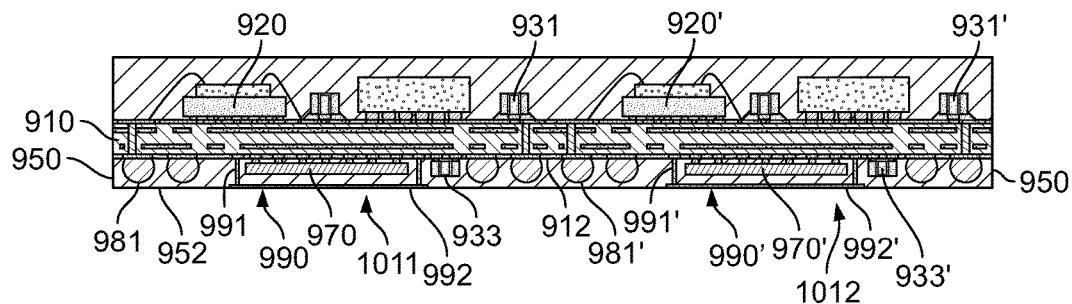
FIGS. 11A-11E illustrate various later semiconductor package assembly leading to the semiconductor package of FIG. 9.

FIGS. 11A-11E illustrate various later stages of assembly subsequent to those of FIGS. 10A-C and leading to semiconductor package 900 (FIG. 9). FIG. 11A presents interconnect inner portion 981 of external interconnect 980 attached to substrate bottom surface 912 at unit portion 1011, and presents interconnect inner portion 981' of external interconnect 980' attached to substrate bottom surface 912 at unit portion 1012. In some examples, interconnect inner portions 981 and 981' can be applied using a solder drop or ball drop process, a screen-printing process, or a plating process. In the same or other examples, interconnect inner portions 981 and 981' can be at least partially reflowed once attached.

FIG. 11A also presents encapsulant 950 applied across and between unit portion 1011 and unit portion 1012 to encapsulate substrate bottom surface 912 and all elements coupled to it, including electronic devices 970 and 970', passive components 933 and 933', and interconnect inner portions 981 and 981'. In the present example, encapsulant 950 is applied such that encapsulant bottom surface 952 fully encapsulates interconnect inner portion 981, electronic device 970, and passive component 933, but there can be examples where encapsulant 950 can be applied leaving the bottom of one or more of such elements exposed.

FIG. 11A further presents compartment shields 990 and 990' respectively shielding electronic devices 970 and 970' at unit portions 1011 and 1012. In some implementations, compartment lateral barriers 991 and 991' can be attached to substrate bottom surface 912 adjacent a periphery of respective electronic devices 970 and 970' and at least partially encapsulated by encapsulant 950. Compartment bottom barriers 992 and 992' can be applied on encapsulant 950, respectively attached to compartment lateral barriers 991 and 991'.

Figure 11B:
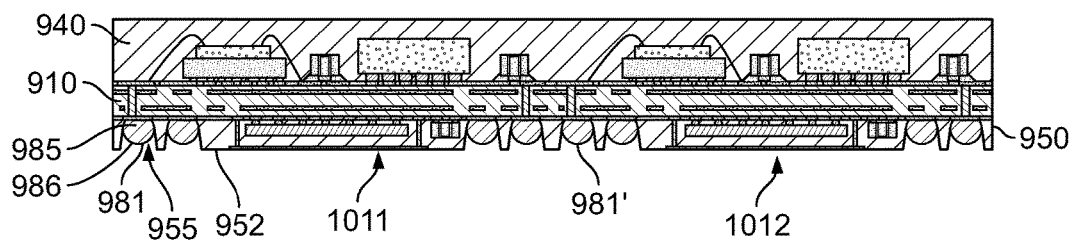

FIG. 11B presents a subsequent stage of assembly where respective sections of encapsulant 950 are removed to expose interconnect inner portions 981 and 981'. Such removal of encapsulant 950 can correspond to through-via 955, thus defining respective portions of interconnect encapsulated section 985 and interconnect exposed section 986. In some examples, through-via 955 can be formed into encapsulant 950 by a laser ablation, by mechanical ablation, and/or or by etching through the material of encapsulant 950.

Figure 11C:
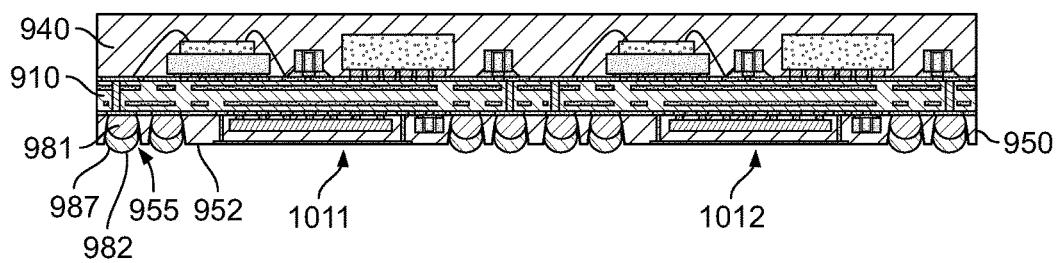

FIG. 11C presents a subsequent stage of assembly where interconnect distal portion 982 is coupled to interconnect inner portion 981 as exposed in through-via 955, such that interconnect distal portion 982 protrudes further than encapsulant bottom surface 952. In some examples, interconnect distal portion 982 can be applied using a solder drop or ball drop process, a screen-printing process, or a plating process. In the same or other examples, interconnect distal portion 982 can be at least partially reflowed once attached.

Figure 11D:
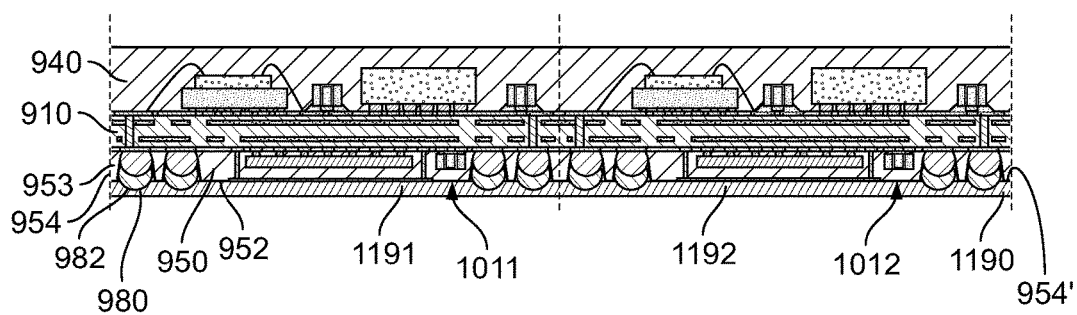

FIG. 11D presents a subsequent stage of assembly where primary tape 1190 is attached. Primary tape 1190 comprises a primary adhesive across its top surface, such that primary tape portion 1191 is adhered under unit portion 1011 and primary tape portion 1192 is adhered under unit portion 1012. Accordingly, the primary adhesive is sealed to encapsulant bottom surface 952 and to external interconnect 980, where in the present example interconnect distal portion 982 protrudes into and/or is encapsulated by a thickness of primary tape 1190. Primary tape 1190 can also comprise a base layer on which the primary adhesive is carried.

Subsequent to attachment of primary tape 1190, singulation along the dotted lines shown in FIG. 11D, through encapsulant 940, through substrate 910, and through primary tape 1190, can separate unit portions 1011 and 1012 from each other. Singulation defines encapsulant perimeter edge 954 of unit portion 1011 at the junction of encapsulant bottom surface 952 and encapsulant lateral surface 953. Primary tape portion 1191 remains attached to unit portion 1011 after singulation, with its primary adhesive still hermetically sealed to the bottom of encapsulant bottom surface 952 and to encapsulant perimeter edge 954. Similarly, primary tape portion 1192 remains attached to unit portion 1012 after singulation, with its primary adhesive still hermetically sealed to the bottom of encapsulant bottom surface 952 and to encapsulant perimeter edge 954'.

Figure 11E:
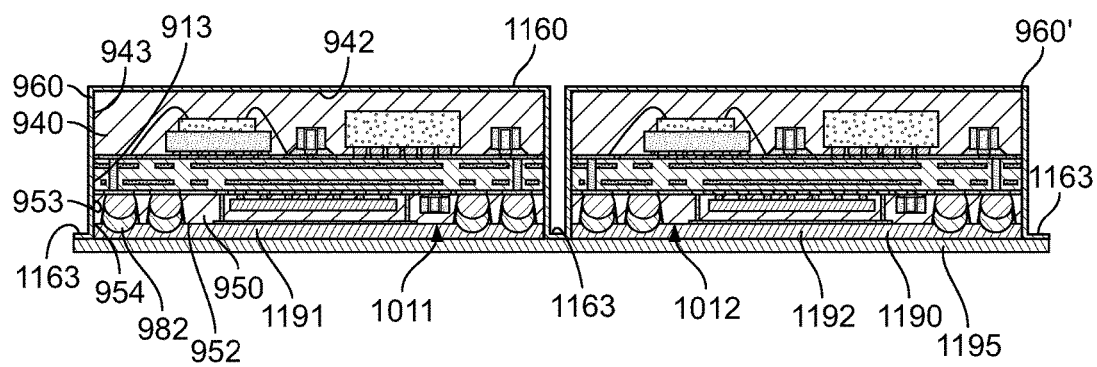

FIG. 11E presents a subsequent stage of assembly where unit portions 1011 and 1012 are attached to a secondary adhesive of secondary tape 1195. Secondary tape 1195 can be supported by a carrier structure, and unit portions 1011 and 1012, along with corresponding primary tape portions 1191 and 1192, can be pick & placed adjacent to each other on secondary tape 1195 such that the bottom of each of primary tape portions 1191 and 1192 is sealed against the secondary adhesive of secondary tape 1195. Secondary tape 1195 is exposed at a gap that separates primary tape portions 1191 from 1192, and unit portions 1011 from 1012. Secondary tape 1195 can also comprise a base layer on which the secondary adhesive is carried. In some examples, the base layers of primary tape 1190 or of secondary tape 1195 can comprise a polyethylene terephthalate and/or a polyimide material.

With the pick & place operation complete, EMI shield layer 1160 is applied. In the present example, EMI shield layer 1160 is applied as a continuous coating that comprises EMI shield 960, EMI shied 960', and remainder EMI shield 1163. EMI shield 960 covers unit portion 1011, including encapsulant top surface 942, encapsulant lateral surface 943, substrate lateral surface 913, and encapsulant lateral surface 953. EMI shield 960' covers corresponding elements of unit portion 1012. Remainder EMI shield 1163 covers a sidewall of primary tape portion 1191, a sidewall of primary tape portion 1192, and portions of secondary tape 1195. In the present example, secondary tape 1195 is covered by remainder EMI shield 1163 wherever exposed from primary tape portions 1191 or 1192, including over the gap that separates primary tape portions 1191 from 1192.

Because the sidewall of primary tape portion 1191 is coplanar with encapsulant lateral surface 953, EMI shield layer 1160 does not bend at encapsulant perimeter edge 954 but rather continues in a substantially straight plane from encapsulant lateral surface 953 to the sidewall of primary tape portion 1191. Without such bend, which would normally happen if the interface between primary tape 1190 and encapsulant lateral surface 953 were instead at a right angle, EMI shield layer 1160 does not accumulate or bulge adjacent encapsulant perimeter edge 954. Accordingly, the thickness of EMI shield layer 1160 remains substantially constant at encapsulant perimeter edge 954 and across the interface with the primary adhesive of primary tape portion 1191.

In some examples, EMI shield layer 1160, including EMI shield 960, EMI shield 960', and remainder EMI shield 1163 can comprise one or more layers or alloys of electrically conductive material such as copper (Cu), nickel (Ni), gold (Au), silver (Ag), platinum (Pt), cobalt (Co), titanium (Ti), chrome (Cr), zirconium (Zr), molybdenum (Mo), ruthenium (Ru), hafnium (Hf), tungsten (W), rhenium (Re), or graphite. In some examples, the EMI shield layer 1160 can comprise a binder to allow internal metal particles to be bonded to one another and to be bonded to encapsulant 140, subsrate 910, and/or to encapsulant 150. In other examples, EMI shield layer 1160 can comprise a conductive polymer doped with a metal or a metal oxide, such as polyacetylene, poylaniline, polypyrrole, polythiophene or poly sulfur nitride. In other examples, EMI shield layer 1160 can comprise a conductive ink prepared by mixing conductive materials, such as carbon black, graphite or silver. Example procedures for forming EMI shield layer 1160 can comprise using spin coating, spraying, electrolytic plating, electroless plating, or sputtering. The thickness of EMI shield layer 1160 can range from about 3 microns to about 7 microns.

With EMI shield layer 1160 applied as shown in FIG. 11E, unit portion 1011 can be pulled from primary tape portion 1191, revealing encapsulant bottom surface 952 and interconnect distal portion 982, and bringing EMI shield 960 along to yield semiconductor package 900 (FIG. 9). During such removal, primary tape portion 1191 remains attached to secondary tape 1195, and EMI shield layer 1160 ruptures precisely along its interface with the primary adhesive of primary tape portion 1191 to thereby separate EMI shield 960 from remainder EMI shield 1163. Unit portion 1012 can be similarly pulled from primary tape portion 1192, such that remainder EMI shield 1163 remains attached to primary tape portions 1191 and 1192, and to secondary tape 1195.

The adhesive strength of the secondary adhesive of secondary tape 1195 that is sealed to the base of primary tape portion 1191 can be greater than the adhesive strength of the primary adhesive of primary tape portion 1191 that is sealed to unit portion 1011. Accordingly, the secondary adhesive can prevent separation of primary tape portion 1191 from secondary tape 1195. This can permit controlled rupturing through the substantially constant thickness of EMI shield layer 1160 throughout encapsulant perimeter edge 954, along the interface between encapsulant lateral surface 953 and the primary adhesive of primary tape portion 1191, to thereby define EMI shield 960. Such constant thickness and controlled rupturing of the EMI shield can permit increased and consistent coverage of encapsulant lateral surface 953, such that no more than an exposed height of 0 to 50 μm, measured vertically from encapsulant bottom surface 952 and along encapsulant lateral surface 953, is exposed from EMI shield 960. This avoids issues such as where EMI shield layer 1160 ruptures past encapsulant perimeter edge 954, leaving a dangling portion of EMI shield 960, and also avoids issues where EMI shield layer 1160 ruptures too far above encapsulant perimeter edge 954, leaving encapsulant lateral surface 953 excessively exposed from EMI shield 960.

Figure 12A:
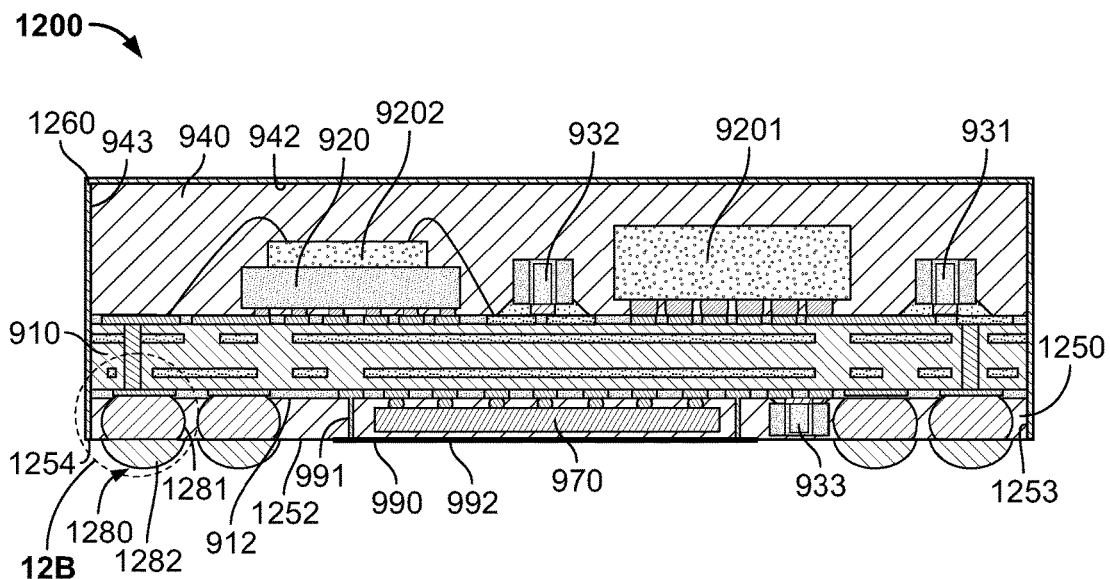
FIG. 12A illustrates a cross-section view of a semiconductor package according to one example.
Figure 12B:
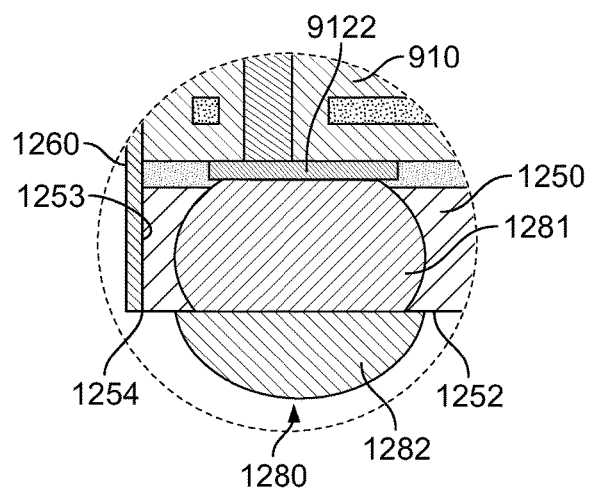
FIG. 12B illustrates a magnified portion of the semiconductor package from FIG. 12A.

FIG. 12A illustrates a cross-section view of semiconductor package 1200 according to one example. FIG. 12B illustrates a magnified portion of semiconductor package 1200 from FIG. 12A. Semiconductor package 1200 and its elements can be similar to any one or more of the other semiconductor packages or their corresponding elements described herein, and characteristics of semiconductor package 1200 are further described below. For example, semiconductor package 1200 can be related to semiconductor package 900 described above, comprising substrate 910, electronic devices 920, 9201, 9202, and 970, passive components 931, 932, and 933, and encapsulant 940, along with corresponding portions and parts of each, and amongst other corresponding features or elements described above with respect to semiconductor package 900. There can be embodiments where semiconductor package 1200 can comprise different combinations of such elements.

Semiconductor package 1200 also comprises external interconnect 1280 having interconnect inner portion 1281 and interconnect distal portion 1282, which can be correspondingly similar to external interconnect 980, interconnect inner portion 981 and interconnect distal portion 982 described above. Furthermore, semiconductor package 1200 comprises encapsulant 1250 that can be similar to encapsulant 950 and its respective elements and portions described above.

Encapsulant 1250 is shown at FIG. 12 encapsulating substrate bottom surface 912, along with any components coupled to it, including electronic device 970 and passive component 933. Although the present example shows encapsulant 1250 covering both lateral and bottom surfaces of such devices and components, there can be examples where the bottom surfaces of one or more of such devices or components may be left exposed by encapsulant 1250. Furthermore, encapsulant 1250 bounds external interconnect 1280 while leaving the distal end of external interconnect 1280 exposed and protruded from encapsulant bottom surface 1252.

FIG. 12B includes a magnified view that presents details of external interconnect 1280 relative to encapsulant 1250. In the present example, encapsulant bottom surface 1252 is coplanar with the bottom of interconnect inner portion 1281, and a top periphery of interconnect distal portion 1282 rests against the portion of encapsulant bottom surface 1252 that bounds the bottom of interconnect inner portion 1281.

FIG. 12 further shows electromagnetic interference (EMI) shield 1260 which is similar to EMI shield 960 described above. EMI shield 1260 covers encapsulant top surface 942 and encapsulant lateral surface 943 of encapsulant 940, and substrate lateral surface 913 of substrate 910. EMI shield 1260 also covers encapsulant lateral surface 1253 of encapsulant 1250 in the present example, and leaves at least a portion of encapsulant bottom surface 1252 exposed such that EMI shield 1260 remains spaced apart from external interconnect 1280.

Semiconductor package 1200 also comprises in the present example compartment shield 990 with compartment lateral barrier 991 and compartment bottom barrier 992, which as described above can be an EMI shield configured to provide EMI protection within a compartment area encompassing one or more components, such as electronic device 970.

Semiconductor package 1200 can be assembled through various stages of assembly, including the initial stages of assembly shown in FIG. 10A-10C. FIGS. 13A-13E illustrate various later stages of assembly subsequent to those of FIGS. 10A-C and leading to semiconductor package 1200 (FIG. 12).

Figure 13A:
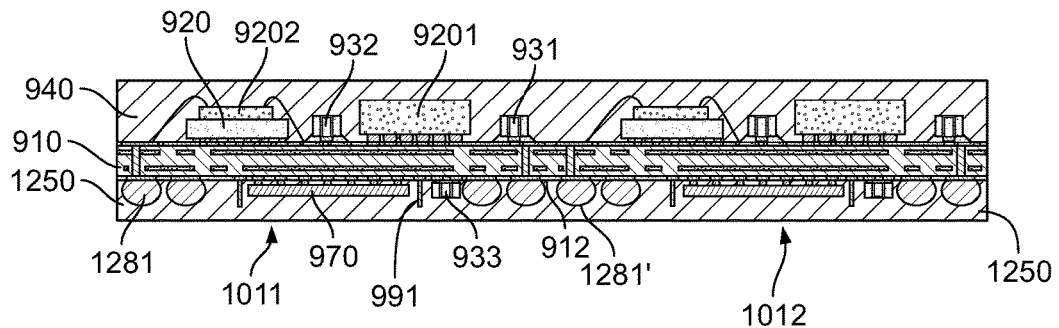
FIGS. 13A-13E illustrate various later semiconductor package assembly leading to the semiconductor package of FIG. 12.

FIG. 13A describes a stage of assembly similar to that of FIG. 11A, but for semiconductor package 1200 (FIG. 12). Interconnect inner portion 1281 of external interconnect 1280 is attached to substrate bottom surface 912 at unit portion 1011, and interconnect inner portion 1281' is attached to substrate bottom surface 912 at unit portion 1012. FIG. 13A also presents encapsulant 1250 applied across and between unit portion 1011 and unit portion 1012 to encapsulate substrate bottom surface 912 and all elements coupled to it, including electronic devices 970 and 970', passive components 933 and 933', and interconnect inner portions 1281 and 1281'. In the present example, encapsulant 1250 is applied to fully encapsulate interconnect inner portion 1281, electronic device 970, and passive component 933, but there can be examples where encapsulant 1250 can be applied leaving the bottom of one or more of such elements exposed. FIG. 13A further presents compartment lateral barriers 991 and 991' attached to substrate bottom surface 912 adjacent a periphery of respective electronic devices 970 and 970' and at least partially encapsulated by encapsulant 1250.

Figure 13B:
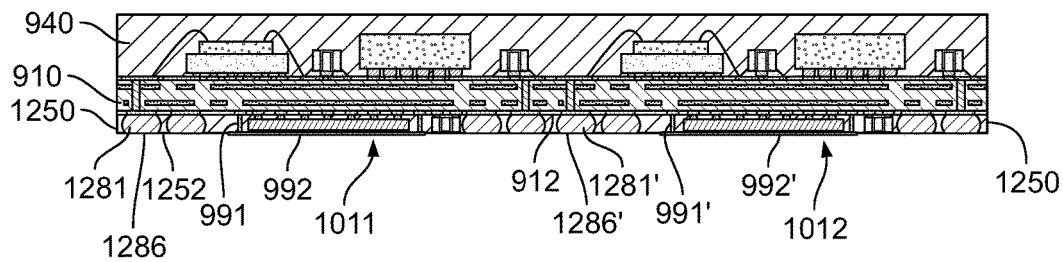

FIG. 13B describes a subsequent stage of assembly, similar to that of FIG. 11B, but for semiconductor package 1200 (FIG. 12). Encapsulant 1250 is partially removed or thinned to expose the bottom of interconnect inner portions 1281 and 1281'. A thinning or planarization process reduces the thickness of encapsulant 1250 until interconnect exposed sections 1286 and 1286' of interconnect inner portions 1281 and 1281' are revealed, being exposed from and coplanar with encapsulant bottom surface 1252 in the present example. In some implementations, the planarization can involve a mechanical grinding process and/or one or more etching stages. In the present example, the planarization also reveals the bottom of compartment lateral barriers 991 and 991'. Compartment bottom barriers 992 and 992' can be applied after such planarization process, respectively covering the areas under electronic device 970 and 970' and respectively in contact with the revealed bottoms of compartment lateral barriers 991 and 991'.

Figure 13C:
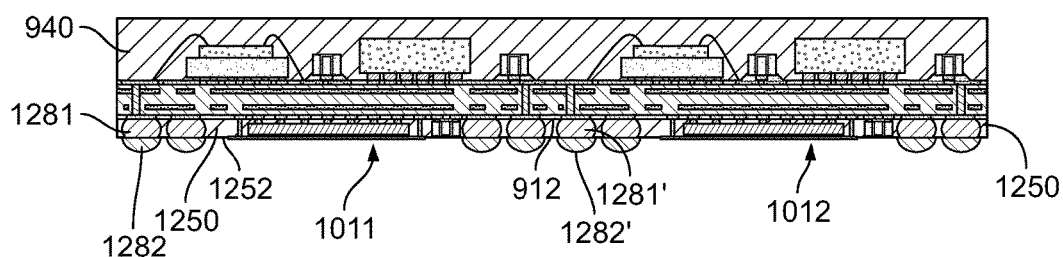

FIG. 13C presents a subsequent stage of assembly, similar to that of FIG. 11C, but for semiconductor package 1200 (FIG. 12). Interconnect distal portions 1282 and 1282' are coupled to interconnect inner portions 1281 and 1281' as exposed by the planarization process of FIG. 13B, and thus protrude further than encapsulant bottom surface 1252. In some examples, interconnect distal portions 1282 and 1282' can be applied using a solder drop or ball drop process, a screen-printing process, or a plating process. In the same or other examples, interconnect distal portions 1282 and 1282' can be at least partially reflowed once attached.

Figure 13D:
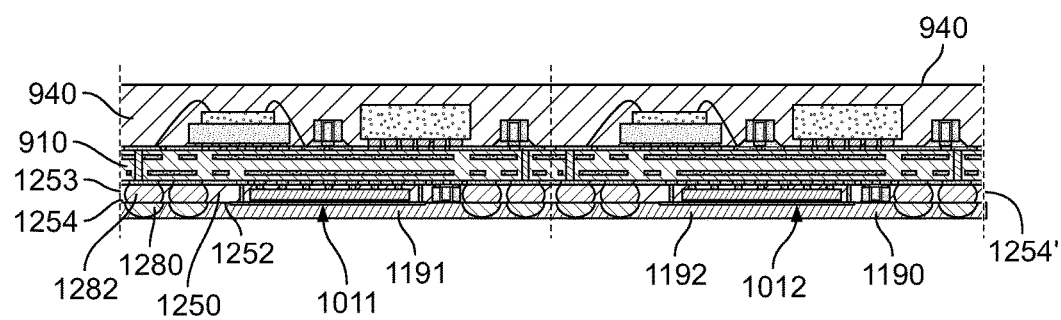

FIG. 13D presents a subsequent stage of assembly, similar to that of FIG. 11D, but for semiconductor package 1200 (FIG. 12). Primary tape 1190 comprises a primary adhesive across its top surface, such that primary tape portion 1191 is adhered under unit portion 1011 and primary tape portion 1192 is adhered under unit portion 1012. Accordingly, the primary adhesive is sealed to encapsulant bottom surface 1252 and to external interconnect 1280, where in the present example interconnect distal portion 1282 protrudes into and/or is encapsulated by a thickness of primary tape 1190.

Subsequent to attachment of primary tape 1190, singulation along the dotted lines shown in FIG. 13D, through encapsulant 940, through substrate 910, and through primary tape 1190, can separate unit portions 1011 and 1012 from each other. Singulation defines encapsulant perimeter edge 1254 of unit portion 1011 at the junction of encapsulant bottom surface 1252 and encapsulant lateral surface 1253. Primary tape portion 1191 remains attached to unit portion 1011 after singulation, with its primary adhesive still hermetically sealed to the bottom of encapsulant bottom surface 1252 and to encapsulant perimeter edge 1254.

Figure 13E:
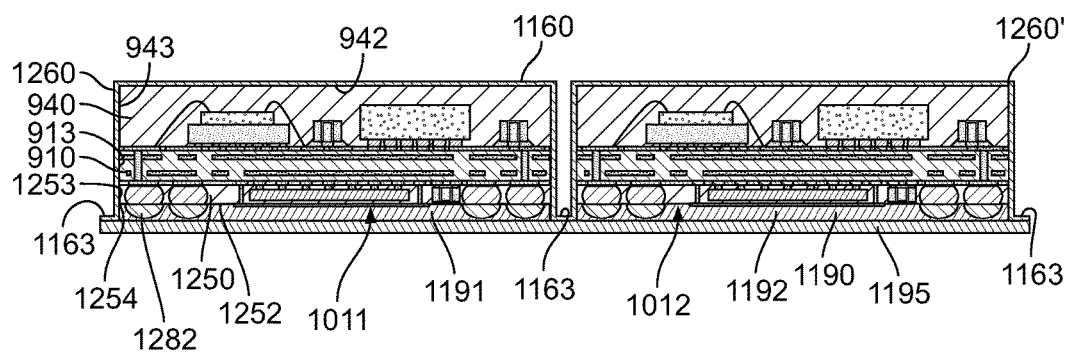

FIG. 13E presents a subsequent stage of assembly, similar to that of FIG. 11E, but for semiconductor package 1200 (FIG. 12). Unit portions 1011 and 1012 are attached to a secondary adhesive of secondary tape 1195. Secondary tape 1195 can be supported by a carrier structure, and unit portions 1011 and 1012, along with corresponding primary tape portions 1191 and 1192, can be pick & placed adjacent to each other on secondary tape 1195 such that the bottom of each of primary tape portions 1191 and 1192 is sealed against the secondary adhesive of secondary tape 1195. Secondary tape 1195 is exposed at a gap that separates primary tape portions 1191 from 1192, and unit portions 1011 from 1012.

With the pick & place operation complete, EMI shield layer 1160 is applied. In the present example, EMI shield layer 1160 is applied as a continuous coating that comprises EMI shield 1260, EMI shied 1260', and remainder EMI shield 1163. EMI shield 1260 covers unit portion 1011, including encapsulant top surface 942, encapsulant lateral surface 943, substrate lateral surface 913, and encapsulant lateral surface 1253. EMI shield 1260' covers corresponding elements of unit portion 1012. Remainder EMI shield 1163 covers a sidewall of primary tape portion 1191, a sidewall of primary tape portion 1192, and secondary tape 1195. In the present example, secondary tape 1195 is covered by remainder EMI shield 1163 wherever exposed from primary tape portions 1191 or 1192, including over the gap that separates primary tape portions 1191 from 1192.

Such an arrangement provides benefits similar to those described above with respect to FIG. 11E, such that the thickness of EMI shield layer 1160 does not bulge but rather remains substantially constant at encapsulant perimeter edge 1254 and across the interface with the primary adhesive of primary tape portion 1191.

With EMI shield layer 1160 applied as shown in FIG. 13E, unit portion 1011 can be pulled from primary tape portion 1191, revealing encapsulant bottom surface 1252 and interconnect distal portion 1282, and bringing EMI shield 1260 along to yield semiconductor package 1200 (FIG. 12). During such removal, primary tape portion 1191 remains attached to secondary tape 1195, and EMI shield layer 1160 ruptures precisely along its interface with the primary adhesive of primary tape portion 1191 to thereby separate EMI shield 1260 from remainder EMI shield 1163. Unit portion 1012 can be similarly pulled from primary tape portion 1192, such that remainder EMI shield 1163 remains attached to primary tape portions 1191 and 1192, and to secondary tape 1195.

The characteristics of primary tape 1190 and secondary tape 1195 remain as described above with respect to FIG. 11E to achieve the constant thickness and controlled rupturing of EMI shield layer 1160, thus permitting increased and consistent coverage of encapsulant lateral surface 1253. Accordingly, no more than an exposed height of 0 to 50 µm, measured vertically from encapsulant bottom surface 1252 and along encapsulant lateral surface 1253, is exposed from EMI shield 1260. This avoids issues where EMI shield layer 1160 ruptures past encapsulant perimeter edge 1254, leaving a dangling portion of EMI shield 1260, and also avoids issues where EMI shield layer 1160 ruptures too far above encapsulant perimeter edge 1254, leaving encapsulant lateral surface 1253 excessively exposed from EMI shield 1260.

Figure 14A:
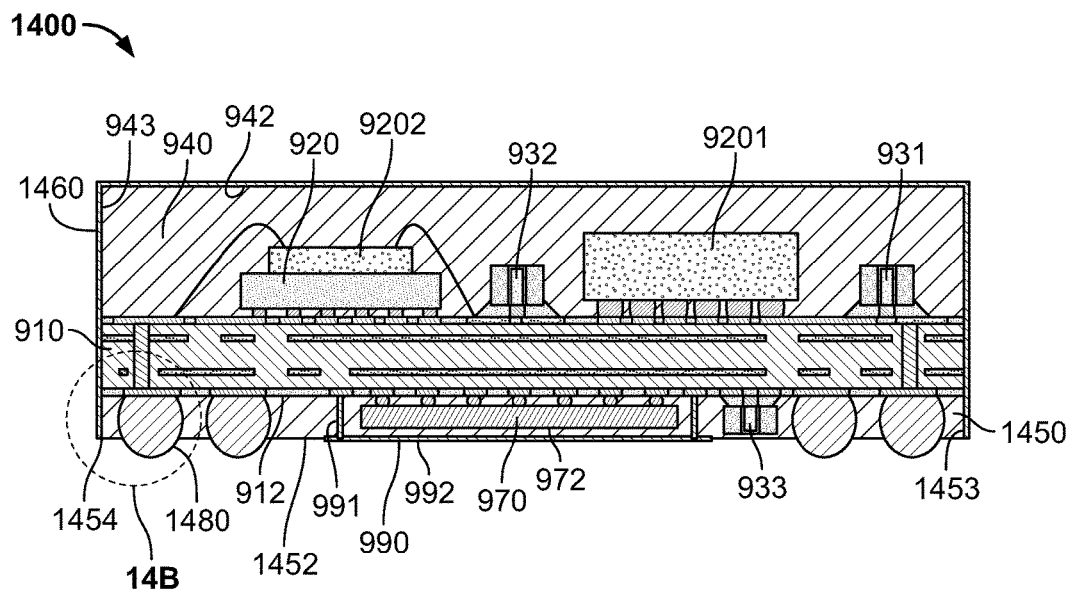
FIG. 14A illustrates a cross-section view of a semiconductor package according to one example.
Figure 14B:
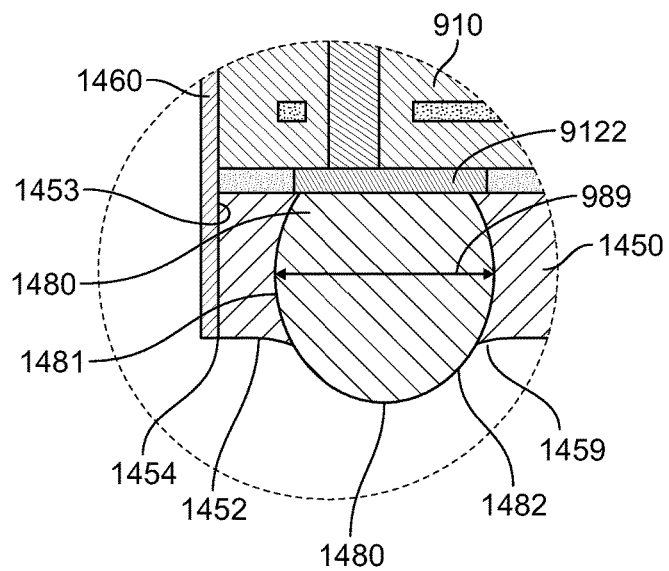
FIG. 14B illustrates a magnified portion of the semiconductor package from FIG. 14A.

FIG. 14A illustrates a cross-section view of semiconductor package 1400 according to one example. FIG. 14B illustrates a magnified portion of semiconductor package 1400 from FIG. 14A. Semiconductor package 1400 and its elements can be similar to any one or more of the other semiconductor packages or their corresponding elements described herein, and characteristics of semiconductor package 1400 are further described below. For example, semiconductor package 1400 can be related to semiconductor package 900 described above, comprising substrate 910, electronic devices 920, 9201, 9202, and 970, passive components 931, 932, and 933, and encapsulant 940, along with corresponding portions and parts of each, and amongst other corresponding features or elements described above with respect to semiconductor package 900. There can be embodiments where semiconductor package 1400 can comprise different combinations of such elements.

Semiconductor package 1400 also comprises external interconnect 1480, which can be similar to external interconnect 980 (FIGS. 9, 11). However, in the present example external interconnect 1480 is shown as a single bump instead of a configuration with dual stacked bumps. Nevertheless, there can be embodiments where external interconnect 1480 can comprise a different configuration, such as dual stacked bumps.

Semiconductor package 1400 also comprises encapsulant 1450 that can be similar to encapsulant 950 (FIGS. 9, 11) and its respective elements and portions described above. Encapsulant 1450 is shown at FIG. 14 encapsulating substrate bottom surface 912, along with any components coupled to it, including electronic device 970 and passive component 933. Although the present example shows encapsulant 1450 covering both lateral and bottom surfaces of such devices and components, there can be examples where the bottom surfaces of one or more of such devices or components may be left exposed by encapsulant 1450. Furthermore, encapsulant 1450 bounds external interconnect 1480 while leaving the distal end of external interconnect 1480 exposed and protruded from encapsulant bottom surface 1452.

FIG. 14 includes a magnified view that presents details of external interconnect 1480 relative to encapsulant 1450. In the present example encapsulant 1450 covers a majority of external interconnect 1480, such that encapsulant bottom surface 1452 extends from substrate bottom surface 912 past a maximum width 1489 of external interconnect 1480. In other examples encapsulant 1450 can cover a minority of external interconnect 1480, such that encapsulant bottom surface extends from substrate bottom surface 912 but does not reach the maximum width of external interconnect 1480. Encapsulant 1450 also exhibits skirt 1459 as a protrusion of encapsulant bottom surface 1452 that bounds the exposed distal end of external interconnect 1480.

FIG. 14 further shows electromagnetic interference (EMI) shield 1460 which is similar to EMI shield 960 described above. EMI shield 1460 covers encapsulant top surface 942 and encapsulant lateral surface 943 of encapsulant 940, and substrate lateral surface 913 of substrate 910. EMI shield 1460 also covers encapsulant lateral surface 1453 of encapsulant 1450 in the present example, and leaves at least a portion of encapsulant bottom surface 1452 exposed such that EMI shield 1460 remains spaced apart from external interconnect 1480.

Semiconductor package 1400 also comprises in the present example compartment shield 990 with compartment lateral barrier 991 and compartment bottom barrier 992, which as described above can be an EMI shield configured to provide EMI protection within a compartment area encompassing one or more components, such as electronic device 970.

Semiconductor package 1400 can be assembled through various stages of assembly, including the initial stages of assembly shown in FIG. 10A-10C. FIGS. 15A-15D illustrate various later stages of assembly subsequent to those of FIGS. 10A-C and leading to semiconductor package 1400 (FIG. 14).

Figure 15A:
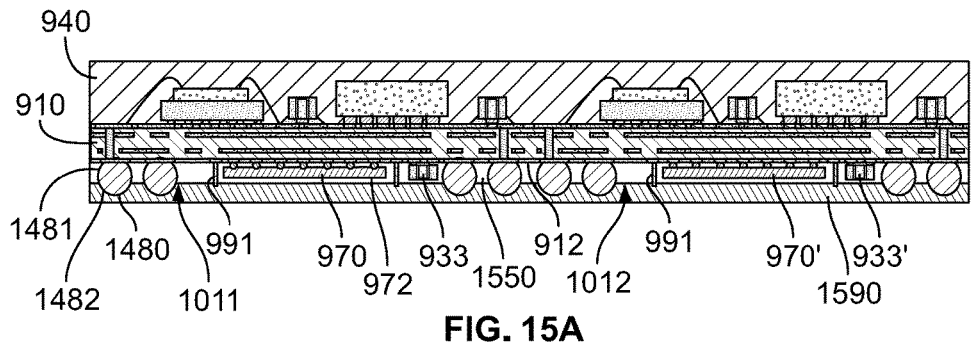
FIGS. 15A-15D illustrate various later semiconductor package assembly leading to the semiconductor package of FIG. 14.

FIG. 15A describes a later stage of assembly for semiconductor package 1400 (FIG. 14). Compartment lateral barriers 991 and 991' are attached to substrate bottom surface 912 adjacent a periphery of respective electronic devices 970 and 970'. External interconnect 1480 are also attached, comprising interconnect inner portion 1481 proximate substrate 910, and interconnect distal portion 1482 distal substrate 910. Film 1590 is applied or suspended under substrate bottom surface 912, covering interconnect distal portion 1482, leaving interconnect inner portion 1481 uncovered, and defining gap 1550 between film 1590 and substrate bottom surface 912. In some implementations, film 1590 also contacts device surface 972 of electronic device 970 when applied. In some examples, film 1590 can comprise a layer or membrane configured to enable film-assist molding.

Figure 15B:
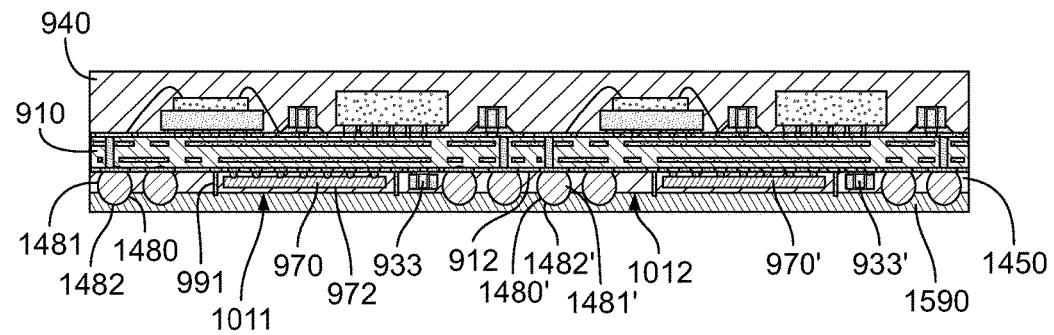

FIG. 15B describes a subsequent stage of assembly for semiconductor package 1400 (FIG. 14). Encapsulant 1450 is applied to fill gap 1550 between film 1590 and substrate bottom surface 912 in a film-assisted molding process. Encapsulant 1450 extends across and between unit portion 1011 and unit portion 1012 to encapsulate substrate bottom surface 912 and all elements coupled to it, including electronic devices 970 and 970', passive components 933 and 933', and interconnect inner portions 1481 and 1481', but leaving interconnect distal portions 1482 and 1482' protruded. Thus, as measured from substrate bottom surface 912, the maximum thickness of encapsulant 1450 remains less than the height of interconnect 1480. In the present example, encapsulant 1450 is applied to fully encapsulate electronic device 970 and passive component 933, but there can be examples where encapsulant 1450 can be applied leaving the bottom of one or more of such elements exposed. For instance, in examples where film 1590 contacts electronic device 970, device surface 972 is left exposed from encapsulant 1450. FIG. 15B further presents compartment lateral barriers 991 and 991' attached to substrate bottom surface 912 and encapsulated by encapsulant 1450.

Figure 15C:
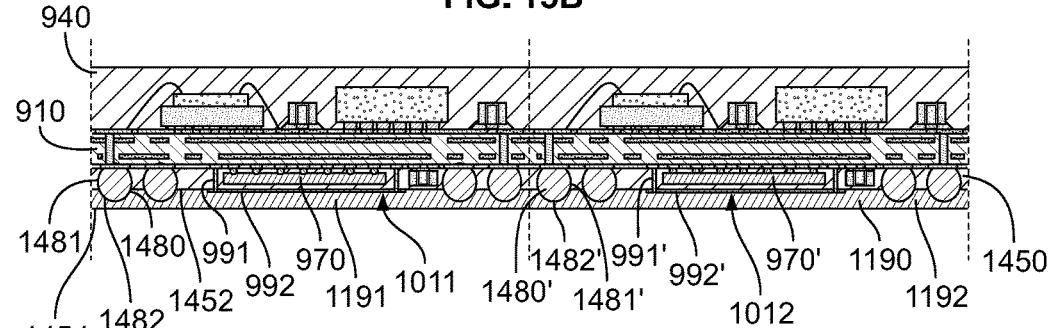

FIG. 15C describes a subsequent stage of assembly, similar to that of FIG. 11D, but for semiconductor package 1400 (FIG. 14). Film 1590 is removed, and compartment bottom barriers 992 and 992' are applied respectively covering the areas under electronic device 970 and 970' and respectively in contact with the revealed ends of compartment lateral barriers 991 and 991'. Primary tape 1190 is shown attached, with its primary adhesive sealed to encapsulant bottom surface 1452 of encapsulant 1450, and to interconnect distal portions 1482 and 1482'. Primary tape 1190 comprises primary tape portion 1191 adhered under unit portion 1011, and primary tape portion 1192 adhered under unit portion 1012. Accordingly, the primary adhesive is sealed to encapsulant bottom surface 1452 and to external interconnect 1480, where in the present example interconnect distal portion 1482 protrudes into and/or is encapsulated by a thickness of primary tape 1190.

Subsequent to attachment of primary tape 1190, singulation along the dotted lines shown in FIG. 15C, through encapsulant 940, through substrate 910, and through primary tape 1190, can separate unit portions 1011 and 1012 from each other. Singulation defines encapsulant perimeter edge 1454 of unit portion 1011 at the junction of encapsulant bottom surface 1452 and encapsulant lateral surface 1453. Primary tape portion 1191 remains attached to unit portion 1011 after singulation, with its primary adhesive still hermetically sealed to the bottom of encapsulant bottom surface 1452 and to encapsulant perimeter edge 1454.

Although FIG. 15C presents primary tape 1190 as distinct from film 1590, there can be examples where film 1590 can comprise or otherwise be the same as primary tape 1190. In such examples, film 1590 need not be removed and replaced with primary tape 1190, since both would be the same.

Figure 15D:
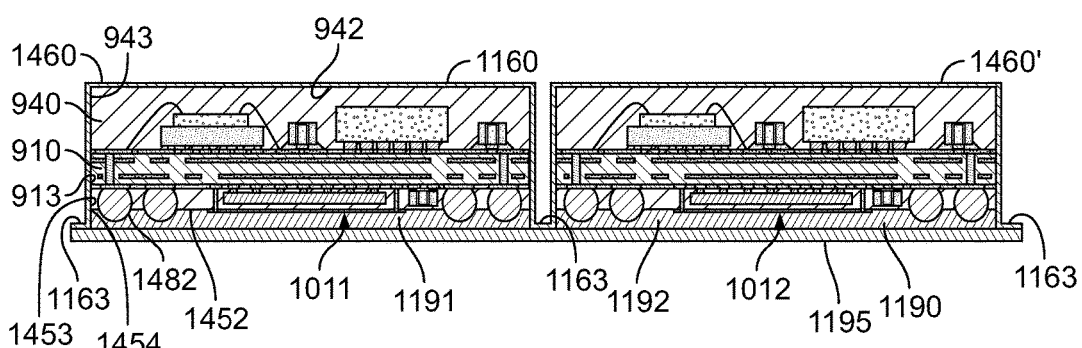

FIG. 15D presents a subsequent stage of assembly, similar to that of FIG. 11E, but for semiconductor package 1400 (FIG. 14). Unit portions 1011 and 1012 are attached to a secondary adhesive of secondary tape 1195. Secondary tape 1195 can be supported by a carrier structure, and unit portions 1011 and 1012, along with corresponding primary tape portions 1191 and 1192, can be pick & placed adjacent to each other on secondary tape 1195 such that the bottom of each of primary tape portion 1191 and 1192 is sealed against the secondary adhesive of secondary tape 1195. Secondary tape 1195 is exposed at a gap that separates primary tape portions 1191 from 1192, and unit portions 1011 from 1012.

With the pick & place operation complete, EMI shield layer 1160 is applied. In the present example, EMI shield layer 1160 is applied as a continuous coating that comprises EMI shield 1460, EMI shied 1460', and remainder EMI shield 1163. EMI shield 1460 covers unit portion 1011, including encapsulant top surface 942, encapsulant lateral surface 943, substrate lateral surface 913, and encapsulant lateral surface 1453. EMI shield 1460' covers corresponding elements of unit portion 1012. Remainder EMI shield 1163 covers a sidewall of primary tape portion 1191, a sidewall of primary tape portion 1192, and secondary tape 1195. In the present example, secondary tape 1195 is covered by remainder EMI shield 1163 wherever exposed from primary tape portions 1191 or 1192, including over the gap that separates primary tape portions 1191 from 1192.

Such an arrangement provides benefits similar to those described above with respect to FIG. 11E, such that the thickness of EMI shield layer 1160 does not bulge but rather remains substantially constant at encapsulant perimeter edge 1454 and across the interface with the primary adhesive of primary tape portion 1191.

With EMI shield layer 1160 applied as shown in FIG. 15D, unit portion 1011 can be pulled from primary tape portion 1191, revealing encapsulant bottom surface 1452 and interconnect distal portion 1482, and bringing EMI shield 1460 along to yield semiconductor package 1400 (FIG. 14). During such removal, primary tape portion 1191 remains attached to secondary tape 1195, and EMI shield layer 1160 ruptures precisely along its interface with the primary adhesive of primary tape portion 1191 to thereby separate EMI shield 1460 from remainder EMI shield 1163. Unit portion 1012 can be similarly pulled from primary tape portion 1192, such that remainder EMI shield 1163 remains attached to primary tape portions 1191 and 1192, and to secondary tape 1195.

The characteristics of primary tape 1190 and secondary tape 1195 remain as described above with respect to FIG. 11E to achieve the constant thickness and controlled rupturing of EMI shield layer 1160, thus permitting increased and consistent coverage of encapsulant lateral surface 1453. Accordingly, no more than an exposed height of 0 to 50 μm, measured vertically from encapsulant bottom surface 1452 and along encapsulant lateral surface 1453, is exposed from EMI shield 1460. This avoids issues where EMI shield layer 1160 ruptures past encapsulant perimeter edge 1454, leaving a dangling portion of EMI shield 1460, and also avoids issues where EMI shield layer 1160 ruptures too far above encapsulant perimeter edge 1454, leaving encapsulant lateral surface 1453 excessively exposed from EMI shield 1460.

Figure 16:
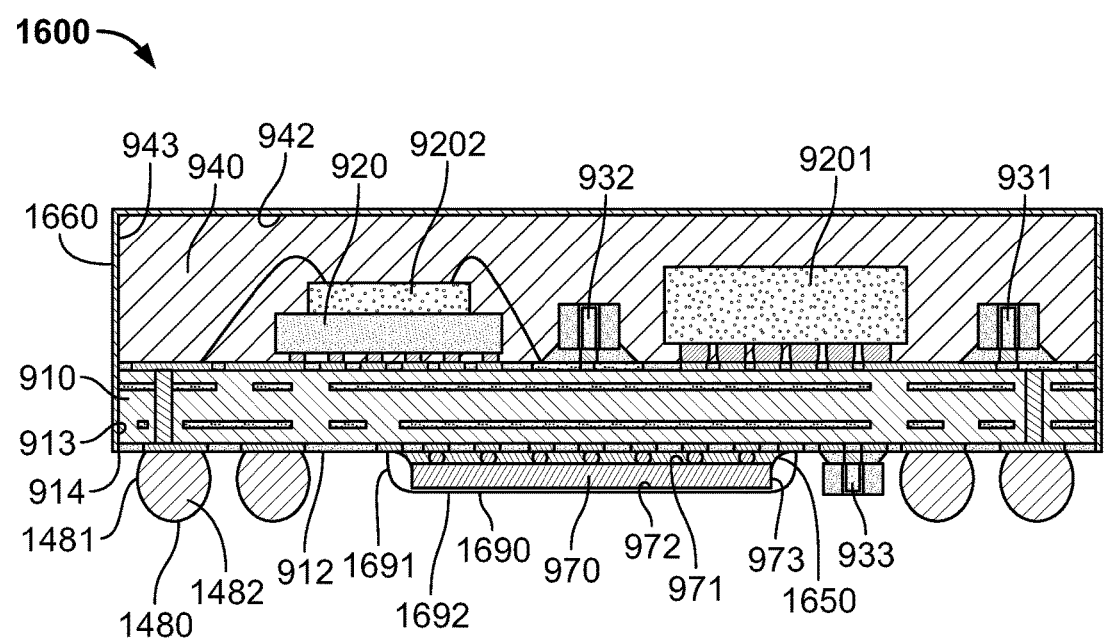
FIG. 16 illustrates a cross-section view of a semiconductor package according to one example.

FIG. 16 illustrates a cross-section view of semiconductor package 1600 according to one example. Semiconductor package 1600 and its elements can be similar to any one or more of the other semiconductor packages or their corresponding elements described herein, and characteristics of semiconductor package 1600 are further described below. For example, semiconductor package 1600 can be related to semiconductor package 900 described above, comprising substrate 910, electronic devices 920, 9201, 9202, and 970, passive components 931, 932, and 933, and encapsulant 940, along with corresponding portions and parts of each, and amongst other corresponding features or elements described above with respect to semiconductor package 900. There can be embodiments where semiconductor package 1600 can comprise different combinations of such elements.

Semiconductor package 1600 also comprises external interconnect 1480, as described above with respect to FIG. 14-15. Although external interconnect 1480 is shown as a single bump, there can be embodiments where it can comprise a different configuration, such as dual stacked bumps.

Semiconductor package 1400 also comprises encapsulant 1650 in the present example, which can be similar in some respects to encapsulant 950 (FIGS. 9, 11) and its respective elements and portions described above. However, encapsulant 1650 differs in the present example by encapsulating the gap between substrate bottom surface 912 and device surface 971 of electronic device 970, along with the bumps of electronic device 970, but being spaced apart from external interconnect 1480. In the present example, encapsulant 1650 also extends partially along device lateral surface 973, and there can be examples where encapsulant 1650 can further fully cover device lateral surface 973 and/or device surface 972 of electronic device 970.

Encapsulant 1650 can comprise one or more materials, such as an epoxy, a thermoplastic material, a thermally curable material, polyimide, polyurethane, a polymeric material, and/or one or more of the materials described above with respect to encapsulant 950. In some examples, encapsulant 1650 can be referred as an underfill, such as a capillary underfill that flows due to capillary action, or a molded underfill that is injected or otherwise applied in a molding process. There can also be examples where encapsulant 1650 can be a pre-applied underfill, such as a non-conductive paste (NCP) or non-conductive film (NCF), that can be applied (e.g., printed, sprayed, adhered) prior to coupling electronic device 970.

FIG. 16 further shows electromagnetic interference (EMI) shield 1660 which is similar to EMI shield 960 described above. EMI shield 1660 covers encapsulant top surface 942 and encapsulant lateral surface 943 of encapsulant 940, and substrate lateral surface 913 of substrate 910.

Semiconductor package 1600 also comprises in the present example compartment shield 1690, similar to compartment shield 990, which as described above can be an EMI shield configured to provide EMI protection within a compartment area encompassing one or more components, such as electronic device 970. Compartment shield 1690 is defined by compartment lateral barrier 1691 and compartment bottom barrier 1692, which in the present example comprise a continuous piece of material that bounds both device surface 972 and device surface 973 of electronic device 970. In some examples, compartment shield 1690 can comprise a metallic can or cover. In other examples, such as where encapsulant 1650 fully covers device lateral surface 973 and device surface 972 of electronic device 970, compartment shield 1690 can be one or more wires wirebonded as a wire cage to substrate bottom surface 912 from one side to a different side of electronic device 970. There can be examples, however, where compartment shield 1690 can be like compartment shield 990, having compartment lateral barrier 991 and compartment bottom barrier 992 of different or non-continuous materials.

Semiconductor package 1600 can be assembled through various stages of assembly, including the initial stages of assembly shown in FIG. 10A-10C. FIGS. 17A-17C illustrate various later stages of assembly subsequent to those of FIGS. 10A-C and leading to semiconductor package 1600 (FIG. 16).

FIG. 17A describes a later stage of assembly for semiconductor package 1600 (FIG. 16). External interconnect 1480 is coupled and comprises interconnect inner portion 1481 proximate substrate 910, and interconnect distal portion 1482 distal substrate 910. Compartment shield 1690 is also shown coupled to substrate bottom surface 912 around electronic device 970, but there can be implementations where compartment shield 1690 can be attached at a later stage if desired.

FIG. 17B describes a subsequent stage of assembly, similar to that of FIG. 11D, but for semiconductor package 1600 (FIG. 16). Primary tape 1190 is shown attached, with its primary adhesive sealed to substrate bottom surface 912 of substrate 910, and to external interconnect 1480. Primary tape 1190 comprises primary tape portion 1191 adhered under unit portion 1011, and primary tape portion 1192 adhered under unit portion 1012. External interconnect 1480 and electronic device 970 protrude into primary tape 1190 such that both are fully embedded within its primary adhesive.

Subsequent to attachment of primary tape 1190, singulation along the dotted lines shown in FIG. 17B, through encapsulant 940, through substrate 910, and through primary tape 1190, can separate unit portions 1011 and 1012 from each other. Singulation defines substrate perimeter edge 914 of unit portion 1011 at the junction of substrate bottom surface 912 and substrate lateral surface 913. Primary tape portion 1191 remains attached to unit portion 1011 after singulation, with its primary adhesive still hermetically sealed to the bottom of encapsulant bottom surface 1452 and to encapsulant perimeter edge 1454.

FIG. 17C presents a subsequent stage of assembly, similar to that of FIG. 11E, but for semiconductor package 1600

(FIG. 16). Unit portions 1011 and 1012 are attached to a secondary adhesive of secondary tape 1195. Secondary tape 1195 can be supported by a carrier structure, and unit portions 1011 and 1012, along with corresponding primary tape portions 1191 and 1192, can be pick & placed adjacent to each other on secondary tape 1195 such that the bottom of each of primary tape portion 1191 and 1192 is sealed against the secondary adhesive of secondary tape 1195. Secondary tape 1195 is exposed at a gap that separates primary tape portions 1191 from 1192, and unit portions 1011 from 1012.

With the pick & place operation complete, EMI shield layer 1160 is applied. In the present example, EMI shield layer 1160 is applied as a continuous coating that comprises EMI shield 1660, EMI shied 1660', and remainder EMI shield 1163. EMI shield 1660 covers unit portion 1011, including encapsulant top surface 942, encapsulant lateral surface 943, and substrate lateral surface 913. EMI shield 1660' covers corresponding elements of unit portion 1012. Remainder EMI shield 1163 covers a sidewall of primary tape portion 1191, a sidewall of primary tape portion 1192, and secondary tape 1195. In the present example, secondary tape 1195 is covered by remainder EMI shield 1163 wherever exposed from primary tape portions 1191 or 1192, including over the gap that separates primary tape portions 1191 from 1192.

Such an arrangement provides benefits similar to those described above with respect to FIG. 11E, such that the thickness of EMI shield layer 1160 remains substantially constant at substrate perimeter edge 914 and across the interface with the primary adhesive of primary tape portion 1191.

In particular, because the sidewall of primary tape portion 1191 is coplanar with substrate lateral surface 913, EMI shield layer 1160 does not bend at substrate perimeter edge 914 but rather continues in a substantially straight plane from substrate lateral surface 913 to the sidewall of primary tape portion 1191. Without such bend, which would normally happen if the interface between primary tape 1190 and substrate lateral surface 913 were instead at a right angle, EMI shield layer 1160 does not accumulate or bulge adjacent substrate perimeter edge 914. Accordingly, the thickness of EMI shield layer 1160 remains substantially constant at substrate perimeter edge 914 and across the interface with the primary adhesive of primary tape portion 1191.

With EMI shield layer 1160 applied as shown in FIG. 17C, unit portion 1011 can be pulled from primary tape portion 1191, thus revealing substrate bottom surface 912 and external interconnect 1480, and bringing EMI shield 1660 along to yield semiconductor package 11600 (FIG. 16). During such removal, primary tape portion 1191 remains attached to secondary tape 1195, and EMI shield layer 1160 ruptures precisely along its interface with the primary adhesive of primary tape portion 1191 to thereby separate EMI shield 1660 from remainder EMI shield 1163. Unit portion 1012 can be similarly pulled from primary tape portion 1192, such that remainder EMI shield 1163 remains attached to primary tape portions 1191 and 1192, and to secondary tape 1195. In some implementations, compartment shield 1690 can be applied after removal of unit portion 1011 from primary tape portion 1191.

The characteristics of primary tape 1190 and secondary tape 1195 remain as described above with respect to FIG. 11E to achieve the constant thickness and controlled rupturing of EMI shield layer 1160, thus permitting increased and consistent coverage of substrate lateral surface 913. Accordingly, no more than an exposed height of 0 to 50 µm, measured vertically from substrate bottom surface 912 and along substrate lateral surface 913, is exposed from EMI shield 1660. This avoids issues where EMI shield layer 1160 ruptures past substrate perimeter edge 914, leaving a dangling portion of EMI shield 1660, and also avoids issues where EMI shield layer 1160 ruptures too far above substrate perimeter edge 914, leaving substrate lateral surface 913 excessively exposed from EMI shield 1660.

FIG. 18 illustrates a cross-section view of semiconductor package 1800 according to one example. Semiconductor package 1800 and its elements can be similar to any one or more of the other semiconductor packages or their corresponding elements described herein, and characteristics of semiconductor package 1800 are further described below. For example, semiconductor package 1800 can be related to semiconductor package 900 described above, comprising substrate 910, electronic devices 920, 9201, 9202, and 970, passive components 931, 932, and 933, and encapsulant 940, along with corresponding portions and parts of each, and amongst other corresponding features or elements described above with respect to semiconductor package 900. There can be embodiments where semiconductor package 1800 can comprise different combinations of such elements. The manner construction for features of semiconductor package 1800 also can be similar to that for corresponding features of one or more of the other semiconductor packages described herein.

Semiconductor package 1800 comprises electronic device 1875, which is coupled between electronic device 970 and substrate 910. Electronic device 1875 can be similar to electronic device 970, as shown in FIG. 18, but there can also be examples where electronic device 1875 can be similar to, for instance, passive device 933. Electronic device 1875 is coupled to device surface 971 of electronic device 970, using flipchip bumps in the present example.

Semiconductor package 1800 also comprises electronic device 1876, which is coupled between electronic device 970 and substrate 910. Electronic device 1875 can be similar to electronic device 1875, but it is coupled instead to substrate bottom surface 912 in the present example. There also can be examples where electronic device 1875 and/or 1876 are omitted.

Semiconductor package 1800 also comprises external interconnect 1480, which is presented as a solder ball bump in the present example. As described above, external interconnect 1480 can be similar to external interconnect 980, including any of the interconnect options described with respect to external interconnect 980 or any of the other external interconnects described herein. For instance, semiconductor package 1800 comprises external interconnect 1880, also similar to external interconnect 980, but presented as a metallic post with solder tip in accordance with one of the interconnect options described for external interconnect 980.

Semiconductor package 1800 further comprises EMI shield 1460, compartment shield 990, and encapsulant 1850, which can be similar to one or more of the corresponding bottom encapsulants described above. There can be other examples where one or more of such elements may be omitted or replaced. For instance, one example can omit encapsulant 1850, and/or EMI shield 1460 can instead be replaced with a shield similar to EMI shield 1660 (FIG. 16-17). The same or other examples can omit compartment shield 990, or can replace compartment shield 990 with a compartment shield similar to compartment shield 1690 (FIG. 16-17).

Figure 19:
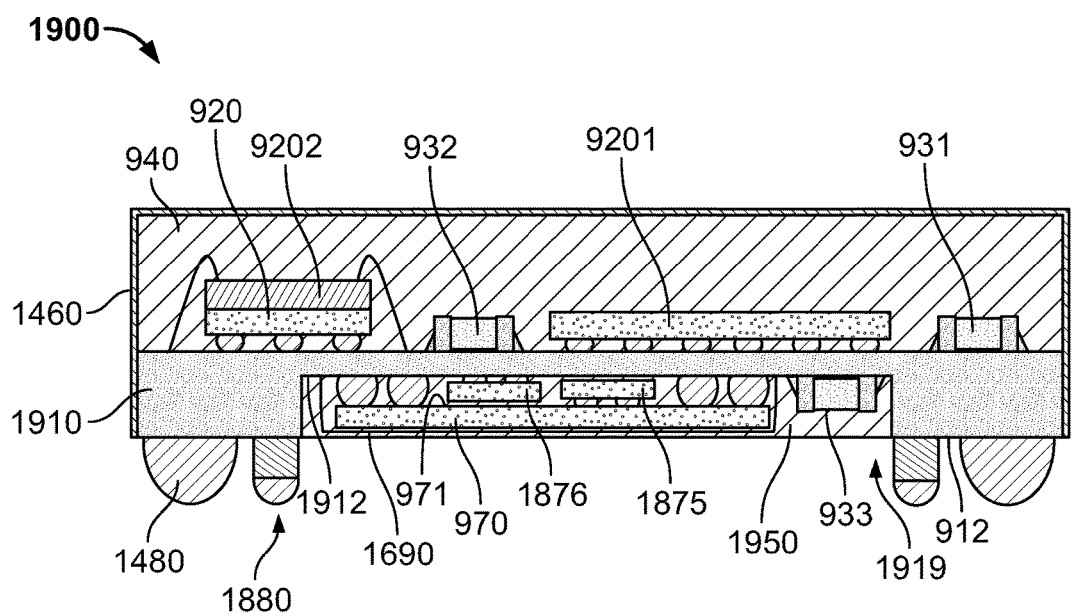
FIG. 19 illustrates a cross-section view of a semiconductor package according to one example.

FIG. 19 illustrates a cross-section view of semiconductor package 1900 according to one example. Semiconductor package 1900 is similar to semiconductor package 1800 (FIG. 18), but comprises substrate 1910 instead. Substrate 1910 can be similar to substrate 910, but comprises substrate cavity 1919 into which one or more elements can be coupled to further decrease the height of package 1900. Substrate bottom section 1912 of substrate 1910 defines a base of substrate cavity 1919, and can be considered a portion of substrate bottom surface 912. In the present example, electronic devices 970, 1875, 1876, and passive component 933 are inserted into substrate cavity 1919, but there can be examples where one or more need not be inserted. There can be examples where at least a portion of one or more of such inserted components can protrude outside substrate cavity 1919. Substrate cavity 1919 is at least partially filled by encapsulant 1950, which can be similar to encapsulant 1850 but extends only under substrate bottom section 1912. Encapsulant 1950 at least partially encapsulates the elements inserted into substrate cavity 1919, but there can be embodiments where encapsulant 1950 can be omitted. Semiconductor package 1900 also is shown with compartment shield 1690 in substrate cavity 1919, but there can be examples where compartment shield 1690 can be omitted or replaced with a compartment shield similar to compartment shield 990.

Figure 20:
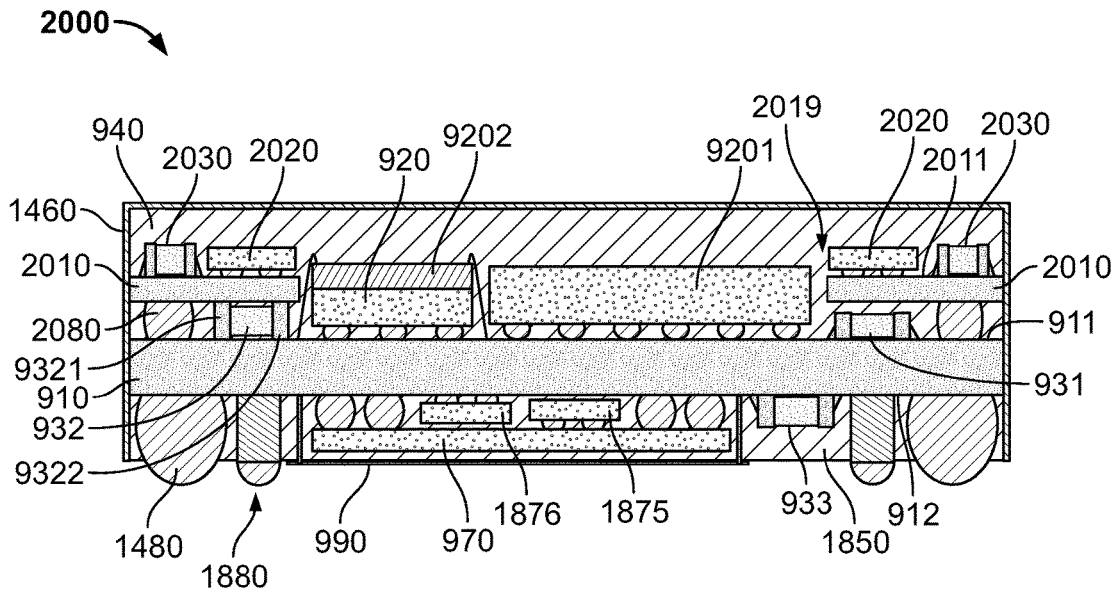
FIG. 20 illustrates a cross-section view of a semiconductor package according to one example.

FIG. 20 illustrates a cross-section view of semiconductor package 2000 according to one example. Semiconductor package 2000 is similar to semiconductor package 1800 (FIG. 18), but comprises substrate 2010 coupled to substrate top surface 911 of substrate 910. Substrate 2010 can be similar to substrate 910, but comprises substrate aperture 2019 that extends throughout a thickness of substrate 2010 and that at least partially bounds a portion of one or more elements of semiconductor package 2000. For instance, electronic devices 920, 9201, and 9202 are bounded within substrate aperture 2019, and can thus protrude through it away from substrate 910 further than the bottom surface of substrate 2010. Substrate top surface 2011 of substrate 2010 can be used for coupling further elements of semiconductor package 2000, such as electronic devices 2020, which can be similar to electronic device 920, or passive components 2030, which can be similar to passive component 931, 932, or 933. In the present example, substrate 2010 is coupled to substrate 910 through interconnect 2080, which can be similar to interconnect 1480 or to one or more of the interconnects described herein. Passive component 932 is shown between substrate 910 and substrate 2010, and in the present example includes terminals 9321 and 9322 that each contact both the top of substrate 910 and the bottom of substrate 2010. Terminal 9321 and/or terminal 9322 of passive component 932 can thus be used as interconnects, similar to, in combination with, and/or instead of interconnect 2080, to transmit signals or voltages between substrate 910 and substrate 2010.

Figure 21:
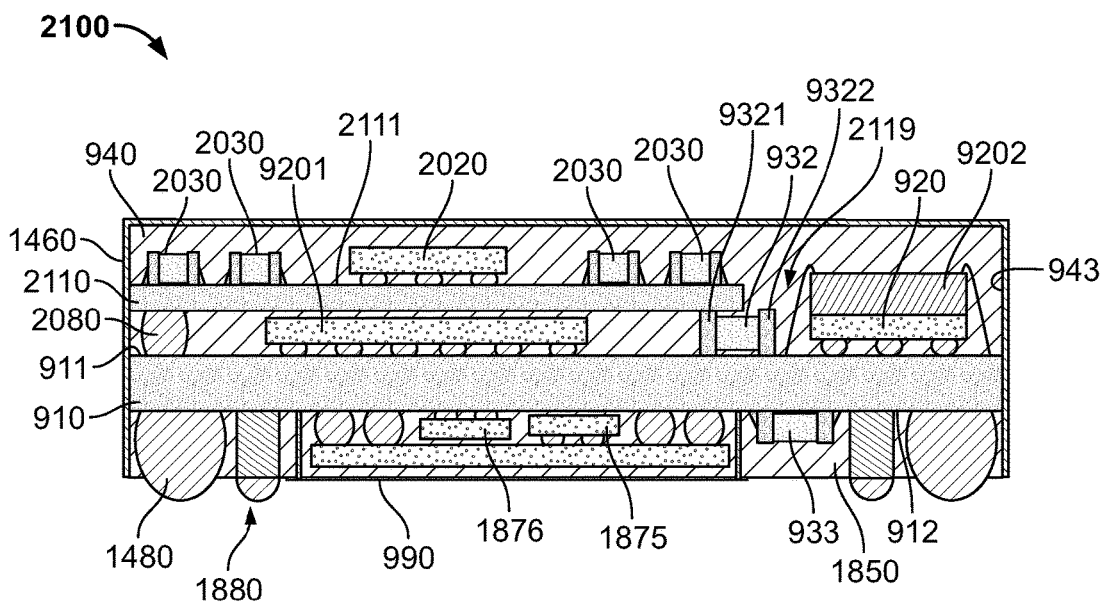
FIG. 21 illustrates a cross-section view of a semiconductor package according to one example.

FIG. 21 illustrates a cross-section view of semiconductor package 2100 according to one example. Semiconductor package 2100 is similar to semiconductor package 2000 (FIG. 20), but comprises substrate 2110 coupled to substrate top surface 911 of substrate 910. Substrate 2110 can be similar to substrate 910, but leaves substrate gap 2119 open above substrate 910, from a lateral surface of substrate 2110 to encapsulant lateral surface 943. Substrate gap 2119 can at least partially bound a portion of one or more elements of semiconductor package 2100. For instance, electronic devices 920 and 9202 are bounded within substrate gap 2119, and can thus protrude through it away from substrate 910 further than the bottom surface of substrate 2110. Substrate top surface 2111 of substrate 2110 can be used for coupling further elements of semiconductor package 2100, such as electronic devices 2020 or passive components 2030. In the present example, substrate 2110 is coupled to substrate 910 through interconnect 2080. Passive component 932 is shown between substrate 910 and substrate 2110, where at least terminal 9321 of passive component 932 contacts both the top of substrate 910 and the bottom of substrate 2110. Thus, at least terminal 9321 of passive component 932 can be used as interconnect, similar to, in combination with, and/or instead of interconnect 2080, to transmit signals or voltages between substrate 910 and substrate 2110.

The discussion herein included numerous illustrative figures that showed various portions of an electronic package assembly and method of manufacturing thereof. For illustrative clarity, such figures did not show all aspects of each example assembly. Any of the example assemblies and/or methods provided herein may share any or all characteristics with any or all other assemblies and/or methods provided herein.

In summary, various aspects of this disclosure provide a semiconductor package and a method of manufacturing a semiconductor package. As a non-limiting example, various aspects of this disclosure provide a semiconductor package, and method of manufacturing thereof, that comprises shielding on multiple sides thereof. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. For example, to provide sufficient volume to encapsulate the respective protruded portions of interconnect 980 (FIG. 9, 11), interconnect 1280 (FIG. 12, 13), or interconnect 1480 (FIG. 14-21) within the primary adhesive of primary tape 1190, the thickness of such primary adhesive can be varied as needed to be greater than such protruded interconnect portions and often greater than the thickness of the base layer of primary tape 1190. Because the secondary adhesive of secondary tape 1195 does not encapsulate such different interconnects, its thickness need not vary across different examples and/or can remain thinner than the thickness of the primary adhesive of primary tape 1190.

In light of the above, it is intended that the disclosure not be limited to the particular example(s) disclosed, but that the disclosure will include all examples falling within the scope of the appended claims.

The invention claimed is:
1. A method of manufacture comprising:
   providing a substrate comprising:
      a substrate top surface having a substrate top first pad and a substrate top second pad,
      a substrate bottom surface having a substrate bottom. first pad and a substrate bottom second pad, and
      a substrate lateral surface;
   attaching a first electronic device to the substrate top surface, the first electronic device coupled to the substrate top first pad and comprising:
      a first device first surface facing the substrate top surface,
      a first device lateral surface, and
      a first device second surface facing away from the substrate top surface;

coupling a first passive component to the substrate top second pad;
applying a first encapsulant to encapsulate the substrate top surface, the first passive component, and the first electronic device, the first encapsulant having:
a first encapsulant top surface, and
a first encapsulant lateral surface;
attaching a second electronic device to the substrate bottom surface, the second electronic device coupled to the substrate bottom first pad and comprising:
a second device first surface facing the substrate bottom side,
a second device lateral surface, and
a second device second surface facing away from the substrate bottom surface;
providing a first external interconnect coupled to the substrate bottom second pad;
applying a second encapsulant to encapsulate the substrate bottom surface and the second electronic device, the second encapsulant comprising:
a second encapsulant lateral surface;
and
applying a first electromagnetic interference (EMI) shield as a layer that bounds at least:
the first encapsulant top surface,
the first encapsulant lateral surface, and
the substrate lateral surface,
wherein the first EMI shield is spaced apart from the external interconnect.

2. The method of claim 1, wherein:
the second encapsulant contacts the second device first surface and a portion of the second device lateral surface;
the second device second surface is exposed from the second encapsulant; and
the second encapsulant is spaced apart from the external interconnect.

3. The method of claim 1, wherein:
the EMI shield covers the substrate lateral surface such that no more than an exposed height of 0 to 50 μm is exposed from the first EMI shield,
the exposed height measured vertically from the substrate bottom surface and along the substrate lateral surface.

4. The method of claim 1, wherein:
the first encapsulant comprises a first layer of a mold material; and
the second encapsulant comprises a second layer of the mold material.

5. The method of claim 1, wherein:
the second encapsulant comprises a second encapsulant bottom surface;
the external interconnect comprises:
an encapsulated section bounded by and in contact with the second encapsulant;
an exposed section bounded by but detached from the second encapsulant; and
a protruded section protruding further than the second encapsulant bottom surface.

6. The method of claim 1, wherein:
the first EMI shield comprises a continuous conformal coating that conforms to respective contours of the first encapsulant top surface, the first encapsulant lateral surface, the substrate lateral surface, and the second encapsulant lateral surface.

7. The method of claim 1, wherein:
the second encapsulant comprises a second encapsulant bottom surface;
the first EMI shield covers the second encapsulant lateral surface such that no more than an exposed height of 0 to 50 μm is exposed from the first EMI shield,
the exposed height measured vertically from the second encapsulant bottom surface and along the second encapsulant lateral surface.

8. The method of claim 1, comprising:
coupling a third electronic device to the substrate top surface;
coupling a fourth electronic device to the substrate bottom surface;
coupling a second passive component to the substrate top surface; and
providing a second external interconnect coupled to the substrate bottom surface;
wherein:
a first unit portion comprises a portion of the substrate to which the first electronic device, the second electronic device, the first passive component, and the first external interconnect are coupled;
a second unit portion is adjacent to the first unit portion and comprises a portion of the substrate to which the third electronic device, the fourth electronic device, the second passive component, and the second external interconnect are coupled; and
the first encapsulant comprises a single layer that encapsulates the first electronic device, the third electronic device, the first passive component, the second passive component, and the substrate top surface across the first unit portion and the second unit portion.

9. The method of claim 8, comprising:
attaching a primary tape across the first unit portion and the second unit portion, the primary tape comprising a primary adhesive and having:
a first tape portion adhered under the first unit portion, and
a second tape portion adhered under the second unit portion;
and
singulating through the first encapsulant, the substrate, and the primary tape to separate the first unit portion with the first tape portion from the second unit portion with the second tape portion;
wherein, after the singulating:
the primary adhesive of the first tape portion remains sealed to an edge of the first unit portion; and
the primary adhesive of the second tape portion remains sealed to an edge of the second unit portion.

10. The method of claim 9, comprising:
attaching the first tape portion and the second tape portion to a secondary adhesive of a secondary tape, wherein the secondary adhesive is stronger than the primary adhesive;
then applying an EMI shield layer as a continuous coating comprising:
the first shield covering the first unit portion,
a second EMI shield covering the second unit portion, and
a remainder EMI shield covering a sidewall of the first tape portion, a sidewall of the second tape portion, and the secondary tape,
removing the first unit portion from the first tape portion, thereby rupturing the first EMI shield from the remainder EMI shield along an interface with the primary adhesive of the first tape portion; and
removing the second unit portion from the second tape portion, thereby rupturing the second EMI shield from the remainder EMI shield along an interface with the primary adhesive of the second tape portion.

11. The method of claim 1, wherein:
the first external interconnect comprises a first interconnect height measured from the substrate bottom surface; and
applying the second encapsulant comprises:
    applying a maximum thickness of the second encapsulant, measured from the substrate bottom surface, to remain less than the first interconnect height.

12. The method of claim 1, comprising:
attaching a primary tape comprising a primary adhesive such that:
    the primary adhesive is sealed to the substrate bottom surface; and
    the second electronic device and the first external interconnect are fully embedded within the primary adhesive;
attaching the primary tape to a secondary tape comprising a secondary adhesive;
applying an EMI shield layer as a continuous coating comprising:
    the first EMI shield covering
        the first encapsulant top surface,
        the first encapsulant lateral surface, and
        the substrate lateral surface,
    and
    a remainder EMI shield covering
        a sidewall of the first tape, and
        the secondary tape;
and
removing the first tape with the secondary adhesive of the second tape, thereby
    revealing the substrate bottom surface, the second electronic device, and the first external interconnect; and
    rupturing the first EMI shield from the remainder EMI shield along an interface with the primary adhesive of the first tape portion.

13. The method of claim 1, wherein:
the first external interconnect comprises
    an interconnect inner portion proximate the substrate, and
    an interconnect distal portion distal the substrate;
and comprising:
    applying a film under the substrate bottom surface, the film covering the interconnect distal portion;
    applying the second encapsulant between the film and the substrate bottom surface, the second encapsulant encapsulating the second electronic device and the interconnect inner portion, leaving the interconnect distal portion protruded from the second encapsulant;
    attaching a primary tape comprising a primary adhesive such that:
        the primary adhesive is sealed to the second encapsulant and the interconnect distal portion;
    attaching the primary tape to a secondary tape comprising a secondary adhesive;
    then applying an EMI shield layer as a continuous coating comprising:
        the first EMI shield covering
            the first encapsulant top surface,
            the first encapsulant lateral surface,
            the substrate lateral surface, and
            the second encapsulant lateral surface,
        and
        a remainder EMI shield covering
            a sidewall of the first tape, and
            the secondary tape;
    and
    removing the first tape with the secondary adhesive of the second tape, thereby revealing the second encapsulant and the interconnect distal portion; and
    rupturing the first EMI shield from the remainder EMI shield along an interface with the primary adhesive of the first tape portion.

14. The method of claim 13, wherein:
applying the film comprises covering the second device second surface; and
applying the second encapsulant comprises leaving the second device second surface exposed from the second encapsulant.

15. The method of claim 1, wherein:
applying the second encapsulant comprises:
    fully encapsulating the second device and the first external interconnect with the second encapsulant, and
    removing a portion of the second encapsulant to partially expose an interconnect exposed section of the first external interconnect;
and comprising:
    coupling an interconnect distal portion to the interconnect exposed section, the interconnect distal portion protruded further than the second encapsulant;
    attaching a primary tape comprising a primary adhesive such that:
        the primary adhesive is sealed to the second encapsulant and the interconnect distal portion;
    attaching the primary tape to a secondary tape comprising a secondary adhesive then applying an EMI shield layer as a continuous coating comprising:
        the first EMI shield covering
            the first encapsulant top surface,
            the first encapsulant lateral surface,
            the substrate lateral surface, and
            the second encapsulant lateral surface, and
        a remainder EMI shield covering
            a sidewall of the first tape, and
            the secondary tape;
    and
    removing the first tape with the secondary adhesive of the second tape, thereby revealing the second encapsulant and the interconnect distal portion; and
    rupturing the first EMI shield from the remainder EMI shield along an interface with the primary adhesive of the first tape portion.

16. The method of claim 15, wherein:
removing the portion of the second encapsulant comprises:
    planarizing the second encapsulant until the interconnect exposed section is exposed and coplanar with the second encapsulant.

17. The method of claim 15, wherein:
removing the portion of the second encapsulant comprises:
    forming a through-via into the second encapsulant to expose the interconnect exposed section;
and the interconnect exposed section is depressed within the via.

18. A method of manufacture comprising:
providing a substrate comprising:
- a substrate top surface having a substrate top first pad and a substrate top second pad,
- a substrate bottom surface having a substrate bottom first pad and a substrate bottom second pad, and
- a substrate lateral surface, attaching a first electronic device to the substrate top surface. the first electronic device coupled to the substrate top first pad and comprising:
- a first device first surface facing the substrate top surface,
- a first device lateral surface, and
- a first device second surface facing away from the substrate top surface;

coupling a first passive component to the substrate top second pad;
applying a first encapsulant to encapsulate the substrate top surface, the first passive component, and the first electronic device, the first encapsulant having:
- a first encapsulant top surface; and
- first encapsulant lateral surface;

attaching a second electronic device to the substrate bottom surface, the second electronic device coupled to the substrate bottom first pad and comprising:
- a second device first surface facing the substrate bottom side,
- a second device lateral surface, and
- a second device second surface facing away from the substrate bottom surface;

providing a first external interconnect coupled to the substrate bottom second pad;
applying a second encapsulant to encapsulate the substrate bottom surface and the second electronic device, the second encapsulant comprising:
- a second encapsulant lateral surface;
and
applying an electromagnetic interference (EMI) shield surrounding a perimeter of the second device, in contact with the second encapsulant, and exclusive of sheet metal.

19. The method of claim 18, wherein:
the EMI shield comprises a plurality of vertical posts surrounding perimeter of the second device, extending from the substrate bottom surface and protruding from the second encapsulant.

20. A semiconductor package comprising:
a substrate having
- a substrate top surface having a substrate top first pad and a substrate top second pad,
- a substrate bottom surface having a substrate bottom first pad and a substrate bottom second pad, and
- a substrate lateral surface;

a first electronic device on the substrate top surface and coupled to the substrate top first pad, the first electronic device comprising:
- a first device first surface facing the substrate top surface,
- a first device lateral surface, and
- a first device second surface facing away from the substrate top surface;

a first passive component coupled to the substrate top second pad;
a first encapsulant that encapsulates the substrate top surface, the passive component, and the first electronic device, the first encapsulant having
- a first encapsulant top surface, and
- a first encapsulant lateral surface;

a second electronic device on the substrate bottom surface and coupled to the substrate bottom first pad, the second electronic device comprising:
- a second device first surface facing the substrate bottom surface,
- a second device lateral surface, and
- second device second surface facing away from the substrate bottom surface;

a first external interconnect coupled to the substrate bottom second pad and comprising a first external interconnect height;
a second encapsulant that encapsulates the substrate bottom surface and the second electronic device,
the second encapsulant comprising:
- a second encapsulant lateral surface, and
- a second encapsulant height,
where the first external interconnect height protrudes further than the second encapsulant height;
and
a first electromagnetic interference (EMI) shield that bounds at least:
- the first encapsulant top surface,
- the first encapsulant lateral surface, and
- the substrate lateral surface,
wherein the first EMI shield is spaced apart from the external interconnect.

* * * * *